United States Patent
Lin et al.

(10) Patent No.: US 10,581,426 B1
(45) Date of Patent: Mar. 3, 2020

(54) SOURCE DOWN POWER FET WITH INTEGRATED TEMPERATURE SENSOR

(71) Applicant: Texas Instruments Incorporated, Dallas, TX (US)

(72) Inventors: Haian Lin, Bethlehem, PA (US); Frank Alexander Baiocchi, Allentown, PA (US); Masahiko Higashi, Fukushima (JP); Namiko Hagane, Fukushima (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/297,963

(22) Filed: Mar. 11, 2019

(51) Int. Cl.
| | |
|---|---|
| *G05F 1/00* | (2006.01) |
| *H02M 3/335* | (2006.01) |
| *H03K 17/14* | (2006.01) |
| *H01L 25/16* | (2006.01) |
| *H01L 21/8249* | (2006.01) |
| *H01L 27/06* | (2006.01) |

(52) U.S. Cl.
CPC ....... *H03K 17/145* (2013.01); *H01L 21/8249* (2013.01); *H01L 25/16* (2013.01); *H01L 27/0623* (2013.01); *H01L 27/0629* (2013.01)

(58) Field of Classification Search
CPC combination set(s) only.
See application file for complete search history.

(56) References Cited

U.S. PATENT DOCUMENTS

| | | | |
|---|---|---|---|
| 7,235,845 B2 | 6/2007 | Xu et al. | |
| 7,994,769 B2* | 8/2011 | Ohtake | H02M 3/1584 323/283 |
| 8,253,398 B2* | 8/2012 | Nakamura | H02M 3/1588 323/225 |
| 2010/0315159 A1 | 12/2010 | Kocon et al. | |
| 2014/0183622 A1 | 7/2014 | Lin et al. | |
| 2015/0214222 A1 | 7/2015 | Wang et al. | |
| 2017/0207335 A1 | 7/2017 | Lin et al. | |
| 2018/0090490 A1 | 3/2018 | Lin et al. | |
| 2018/0130789 A1 | 5/2018 | Lin et al. | |
| 2018/0204917 A1 | 7/2018 | Lin et al. | |

OTHER PUBLICATIONS

Matt Romig, Ozzie Lopez, "3D packaging advancements drive performance, power and density in power devices", Texas Instruments, Jul. 2011, 9 pages.

* cited by examiner

*Primary Examiner* — An T Luu
(74) *Attorney, Agent, or Firm* — Andrew R. Ralston; Charles A. Brill; Frank D. Cimino

(57) ABSTRACT

An electronic device includes a first semiconductor die with a first FET having a drain connected to a switching node, a source connected to a reference node, and a gate connected to a first switch control node. The first die also includes a diode-connected bipolar transistor that forms a temperature diode next to the first FET. The temperature diode includes a cathode connected to the reference node, and an anode connected to a bias node. The electronic device also includes a second semiconductor die with a second FET, and a package structure that encloses the first and second semiconductor dies.

20 Claims, 18 Drawing Sheets

US 10,581,426 B1

SOURCE DOWN POWER FET WITH INTEGRATED TEMPERATURE SENSOR

BACKGROUND

Field effect transistors (FETs) can be used in power switching circuits, such as DC-DC converters. In these and other applications, high power density and energy efficiency are desirable. Power switching circuit efficiency generally decreases with increasing FET operating temperature. Switching signals can be modified according to FET temperature to facilitate efficient operation, if the FET temperature can be accurately determined. A temperature diode in a driver integrated circuit (IC) may give an incorrect temperature reading due to a temperature difference between the driver IC and FETs in a different semiconductor die or dies. Different packaging configurations of FET dies and controller or driver dies can lead to different temperature inaccuracies and inhibit energy efficiency for power circuits and the like.

SUMMARY

This summary is provided to introduce a brief selection of concepts in a simplified form that are further illustrated and described below. This summary is not intended to limit the scope of the claimed subject matter.

Described aspects include an electronic device with a first semiconductor die. The first die includes a first FET with a drain connected to a switching node, a source connected to a reference node, and a gate connected to a first switch control node. The first die also includes a temperature diode with a cathode connected to the reference node, and an anode connected to a bias node. The electronic device further includes a second FET with a second drain connected to an input node, a second source connected to the switching node, and a second gate connected to a second switch control node. The electronic device further includes a driver circuit, and a package structure that encloses the first semiconductor die, the second FET, and the driver circuit.

Another aspect includes a method of forming an electronic device. The method includes forming a dielectric layer along a surface of a semiconductor surface layer with majority carrier dopants of a first conductivity type, and implanting dopants of a second conductivity type into the semiconductor surface layer to form an FET drain region and a bipolar transistor base region adjacent to an emitter region. The method also includes implanting dopants of the first conductivity type to form an FET channel region and a bipolar transistor collector region adjacent to the base region. The method further includes performing an etch process that etches a first trench adjacent to an FET source region in the semiconductor surface layer and a second trench adjacent to the collector region and a second base region of the bipolar transistor, as well as forming a source contact in and below the first trench that electrically connects the source to a substrate under the semiconductor surface layer, and forming a cathode contact in and below the second trench that electrically connects the implanted base region and the implanted collector region to the substrate.

DETAILED DESCRIPTION

Figure 1:
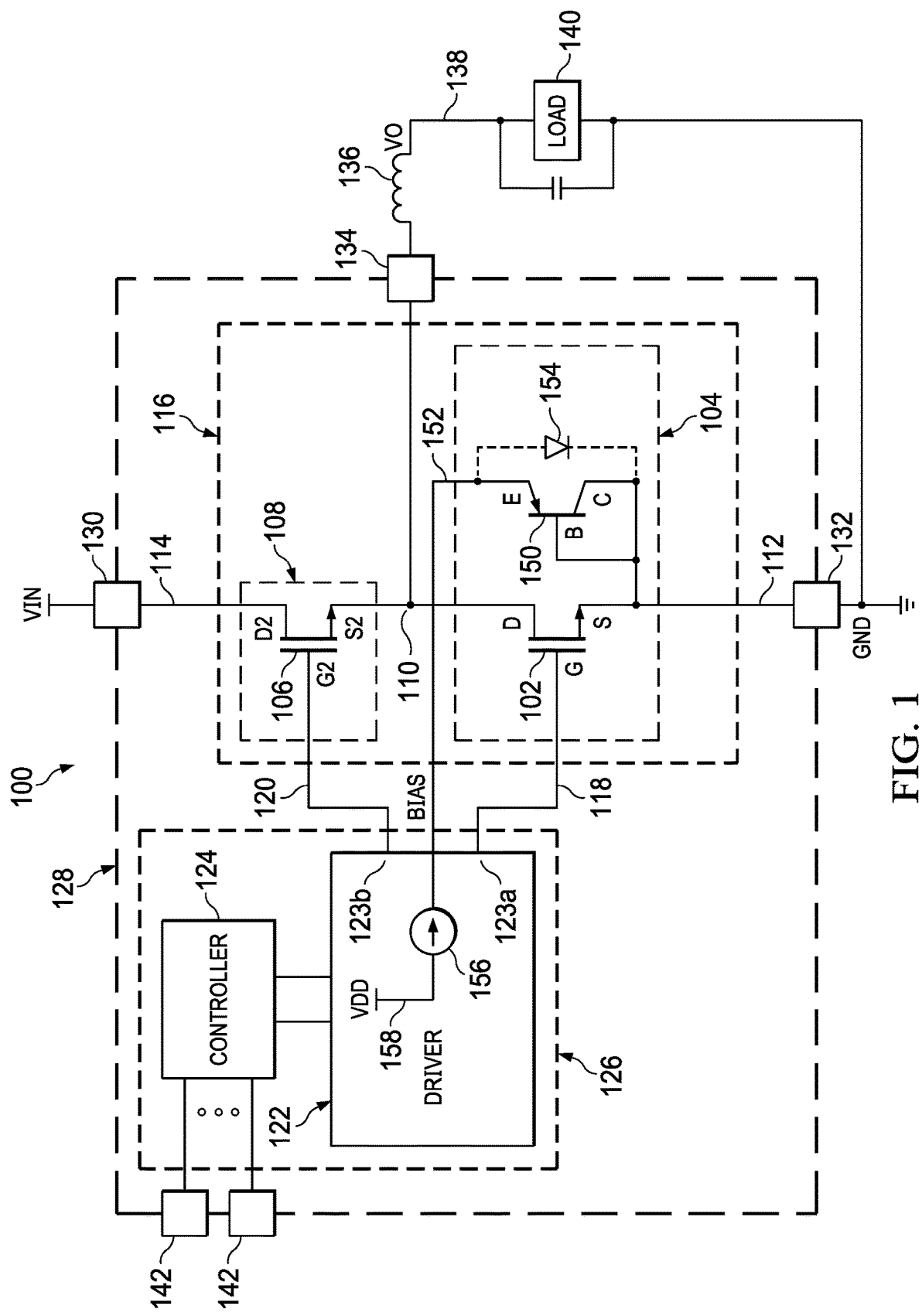
FIG. 1 shows a schematic diagram of a DC-DC converter that includes a packaged power stage electronic device with a source down low side field effect transistor and an integrated temperature sensor in a single die.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner like the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections. The various features of the disclosed examples can be used in connection with a variety of different semiconductor devices, including without limitation integrated circuits having multiple electronic components, as well as single component semiconductor devices (e.g., single transistor products, single diode products, etc.).

Referring initially to FIG. 1, described examples provide integrated thermal sensing features next to a FET to create accurate temperature information from one or more power FETs for use by a driver IC or other driver or controller circuit. The integration of a thermal diode (e.g., a diode-connected bipolar transistor) in the same die as a power FET provides accurate temperature information that can be used to facilitate high efficiency operation of a DC-DC converter or other circuit using one or more power FETs. In certain examples, a diode-connected bipolar transistor can be integrated into a first die that includes a FET by adding a single mask to a fabrication process, thereby facilitating improved circuit operation without significant impact on manufacturing cost or complexity.

FIG. 1 shows a DC-DC buck converter that includes a packaged power stage electronic device 100. The electronic device 100 includes a first FET 102 in a first semiconductor die 104, and a second FET 106 in a second semiconductor die 108. In the illustrated example, the first and second FETs 102 and 106 are n-channel MOSFET devices (NMOS). In another example, one or both FETs 102, 106 can be p-channel MOSFET devices (PMOS, not shown). The first FET 102 includes a drain (labeled D in the drawings) connected to a switching node 110, as well as a source (labeled S) connected to a reference node 112 and a gate (labeled G). The second FET 106 includes a second drain (labeled D2)

connected to an input node 114, a second source (labeled S2) connected to the switching node 110, and a second gate (labeled G2).

The FETs 102 and 104 in FIG. 1 are connected as low and high-side switches, respectively, in a buck converter arrangement. In this configuration, the input node 114 is connected to receive a DC input voltage signal VIN, and the reference node 112 is connected to a ground (e.g., labeled GND in FIG. 1). In other examples, the first and second FETs can be connected in a boost converter configuration, a buck-boost configuration, or other circuit arrangement (not shown).

In one example, the first and second semiconductor dies 104 and 108 are packaged together in a module or package 116, shown in dashed line in FIG. 1. The package 116 in one example includes one or more conductive features, such as clips (not shown) to interconnect the dies 104 and 108 and to provide electrical connections for the switching node 110, the input node 114, and the reference node 112. In another example, the first and second semiconductor dies 104 and 108 are packaged together with one or more further circuits (e.g., additional die or dies) in a single package structure, such as a molded material.

The gate G of the first FET 102 in FIG. 1 is connected to a first switch control node 118, and the second gate G2 is connected to a second switch control node 120. The electronic device 100 also includes a driver circuit 122 (labeled DRIVER). The driver circuit 122 includes a first output connected to the first switch control node 118 and a second output connected to the second switch control node 120. In one example, the driver circuit 122 includes amplifier circuits, level shifting circuits, and/or other suitable circuitry (not shown) to provide switching control signals 123a and 123b, respectively, to the switch control nodes 118 and 120 in order to operate the respective first and second FETs 102 and 106.

The electronic device 100 in FIG. 1 also includes a control circuit 124 (labeled CONTROLLER) that provides pulse width modulated signals to the driver circuit 122 to implement open or closed loop control of an output signal by selective operation of the FETs 102 and 106. In one example, the driver circuit 122 and the control circuit 124 are integrated in a third semiconductor die 126. In this example, the first die 104, the second die 108 and the third die 126 are packaged in a single package structure 128 that encloses the first semiconductor die 104 including the FET 102, the second die 108 including the second FET 106, and the third die 126 including the driver circuit 122. In another example, the control circuit 124 can be omitted from the packaged electronic device 100, and the driver circuit 122 is provided with external connections to receive pulse width modulated signals from which the switch control signals 123 are generated to operate the FETs 102 and 106. In another implementation, the driver circuit 122 and the control circuit 124 can be omitted from the package electronic device 100, and the device includes external connections to receive signals at the first and second switch control nodes 118 and 120.

The electronic device 100 in FIG. 1 includes externally accessible electrical connections, referred to herein as terminals (e.g., pins, pads, etc.) that allow electrical interconnection of the device 100 with external circuitry. A first terminal 130 is connected to the input node 114, a second terminal 132 is connected to the reference node 112, and a third terminal 134 is connected to the switching node 110. This allows connection of an external inductor 136 between the switching node 110 and a DC-DC converter output node 138. In operation in this example, the FETs 102 and 106 operate as low and high-side drivers according to switching control signals 123 from the driver circuit 122 to modulate a voltage of the switching node 110. The output node 138 provides a DC output voltage signal VO to a load 140 connected between the output node 138 and the reference node 112 (e.g., GND). Modulation of a pulse width of the switching control signals 123 operates to control the amplitude of the DC output voltage signal VO. The package electronic device 100 in this example also includes one or more additional terminals 142 connected to the control circuit 124. The terminals 142 in one example can be used to provide one or more feedback or other control signals or power supply and ground (e.g., output voltage VO, output current, input set point signal, etc.) for closed-loop operation of the buck DC-DC converter. The control circuit 124 in one example implements proportional-integral (PI), proportional-integral-derivative (PID) or other suitable regulation functions to regulate one or more measured operating conditions (e.g., output voltage amplitude, output current, etc.) with respect to a setpoint or other internal or external reference (not shown).

In one example, the control circuit 124 and/or the driver circuit 122 are configured to selectively modify the switching control signals 123 that operate the FETs 102, 104 at least partially according to, or based upon, a temperature signal that represents the operating temperature of one or both FETs 102, 104. In one example, inclusion of temperature information in the open or closed loop operation of the DC-DC converter facilitates enhanced energy efficiency. The first semiconductor die 104 in FIG. 1 includes a diode-connected pnp bipolar transistor 150 with an emitter (labeled E) connected to a bias node 152, as well as a base (labeled B) connected to the reference node 112 and a collector (labeled C) connected to the reference node 112. In another example, a diode-connected npn bipolar transistor can be used (not shown).

In one example, the bipolar transistor 150 is integrated near the first FET 102 on the first semiconductor die 104 as illustrated and described further below in connection with FIG. 3. The bipolar transistor 150 is located in such proximity to the first FET 102 to allow a temperature sense signal created by the transistor 150 to represent the temperature of the first FET 102. The diode-connection of the example bipolar transistor 150 near the first FET 102 provides a temperature diode 154 that senses the operating temperature of the first FET 102. In another example, the temperature diode 154 is implemented by a single p-n junction structure in the first semiconductor die 104 (not shown). The temperature diode 154 has a cathode (e.g., the interconnected transistor base and collector) connected to the reference node 112 and an anode (e.g., the transistor emitter) connected to the bias node 152 as shown in dashed line in FIG. 1. The driver circuit 122 includes a current source 156 connected to a supply voltage node 158 (VDD). The current source 156 is connected to a third output of the driver circuit 122. The third output is connected to the bias node 152 to source or sink a bias current signal (labeled BIAS) to or from the bipolar transistor emitter E (e.g., to the anode of the temperature diode 154). In one example, the driver circuit 122 includes sense circuitry (not shown) that senses a voltage signal from the bias node 152 that represents the temperature of the temperature diode 154, and hence the temperature of the first FET 102.

Figure 2:
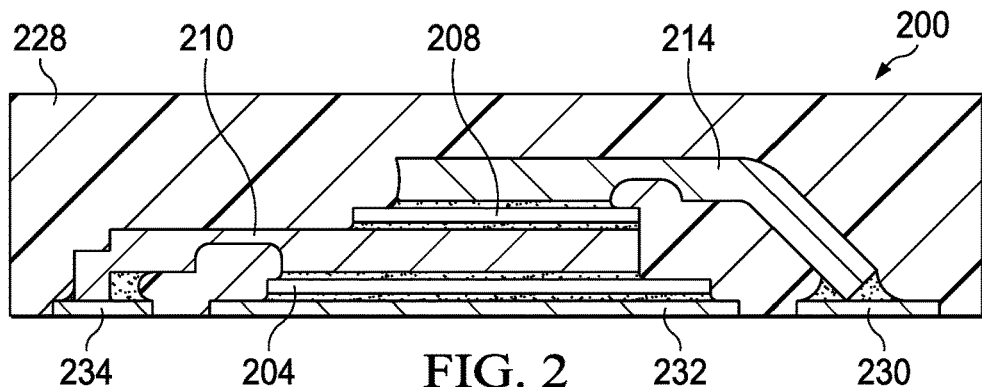
FIG. 2 shows a partial sectional side elevation view of a stacked power stage packaged module in the electronic device of FIG. 1.

FIG. 2 shows a stacked power stage packaged module electronic device 200, which is an example implementation of the electronic device 100 of FIG. 1. The electronic device 200 in FIG. 2 includes a first die 204 that is an implementation of the first die 104 with an included first FET in FIG. 1. The electronic device 200 also includes a second die 208 that is an implementation of the second die 108 with an included second FET in FIG. 1. The electronic device 200 further includes a first conductive metal clip 210 that constitutes the switching node 110 of FIG. 1, and a second conductive metal clip 214 that constitutes the input node 114 in FIG. 1. The electronic device 200 in FIG. 2 also includes a molded package structure 228 that encloses the first and second semiconductor dies 204 and 208, respectively. In addition, the electronic device 200 includes conductive metal terminals on a bottom side of the molded package structure 228. A first conductive metal terminal 230 provides external connection to the input node 214 and is an example implementation of the first terminal 130 in FIG. 1. A second conductive metal terminal 232 provides external connection to the first die 204 and is an example implementation of the second terminal 132 in FIG. 1. A third conductive metal terminal 234 provides external connection to the switching node 210 and is an example implementation of the third terminal 134 in FIG. 1.

The stacked configuration of the first and second dies 204 and 208 in FIG. 2 provides a compact structure with enhanced power density for DC-DC converters or other power conversion applications. In one example, a temperature diode (e.g., diode 154 in FIG. 1) is integrated in one or both first and second semiconductor dies 204, 208 in the example of FIG. 2. In one example, the electronic device 200 includes a third die for a driver circuit (e.g., circuit 122 in FIG. 1) and/or a control circuit (e.g., control circuit 124 in FIG. 1). The electronic device 200 includes electrical connections (not shown) between the integrated temperature diode of one or both dies 204, 208 and the included driver circuit or control circuit to provide a signal that represents the temperature of one or both of the FETs 102 and/or 106.

Figure 3:
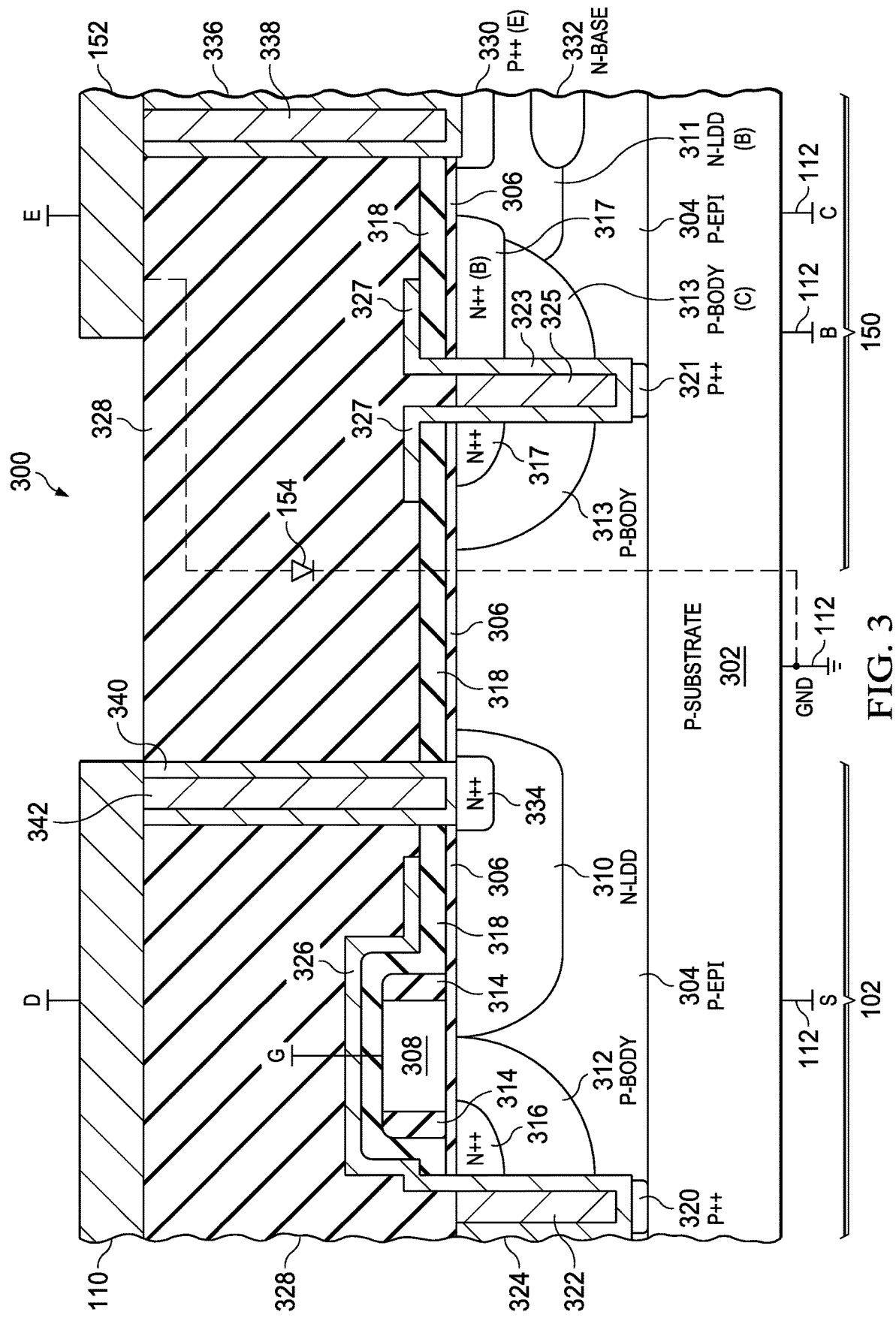
FIG. 3 shows a partial sectional side elevation view of an example low side field effect transistor and integrated temperature sensor in a single die.

FIG. 3 shows a partial sectional side elevation view of an example low side transistor and integrated temperature sensor in a first die 300, which is an example implementation of the first die 104 of FIG. 1 and the first die 204 in FIG. 2. The example implementation of the first die 300 includes an n-channel first FET 102 and a pnp diode-connected bipolar transistor, e.g. the transistor 150. Other implementations are possible to provide a p-channel FET and/or an npn bipolar transistor with dopant conductivity types reversed. In the illustrated example, the first semiconductor die 300 includes a substrate 302 (labeled P-SUBSTRATE) that is connected to the reference node 112. As schematically shown in FIG. 3, the substrate 302 also provides the reference node connections for the base B and collector C of the diode-connected bipolar transistor 150 that is an implementation of the temperature diode 154 of FIG. 1. In addition, the substrate 302 provides the reference node connection for the source S of the first FET 102. In one example, the substrate 302 is a silicon structure that includes p-type dopants (e.g., boron). The first die 300 also includes a p-type epitaxial silicon surface layer 304 (labeled P-EPI, referred to herein as a semiconductor surface layer). The semiconductor surface layer 304 extends over the upper surface of the silicon substrate 302. In the illustrated example, the substrate 302 and the semiconductor surface layer 304 include majority carrier dopants of the first conductivity type (P). The P-type structures and regions are described herein as having majority carrier dopants of a first conductivity type (P), and n-type structures and regions are described as including majority carrier dopants (e.g., phosphorus) of a second conductivity type (N). In other examples, the dopant types can be reversed (e.g., the first conductivity type is N and the second conductivity type is P).

The first die 300 also includes the example first FET 102 and the example diode-connected bipolar transistor 150 integrated in the first die 300 next to the first FET 102 (e.g., the transistors 102 and 150 are adjacent and no other devices are located between them, such as within a transistor device width of each other). A dielectric layer 306 extends along at least a portion of a surface of the semiconductor surface layer 304. In one example, the dielectric layer 306 is or includes an oxide material, such as silicon dioxide, with a thickness suitable for operation as a gate dielectric or gate oxide of the first FET 102. A patterned gate electrode 308 (e.g., polysilicon) extends above a portion of the dielectric layer 306 to form the gate G of the first FET 102. The first die 300 also includes an n-type implanted drain region 310 (labeled N-LDD) of the first FET 102, and an n-type first implanted base region 311 (also labeled N-LDD) of the bipolar transistor 150. In one example, the implanted regions 310 and 311 have approximately equal depth dimensions and dopant concentration profiles within process tolerance ranges, as these can be formed concurrently using a single implant process. The first die 300 further includes p-type implanted regions 312 and 313 in the semiconductor surface layer 304. The implanted region 312 forms an implanted channel under the gate 308 and adjacent to the implanted drain region 310 of the first FET 102. The implanted region 313 forms an implanted collector region 313 of the bipolar transistor 150 adjacent to the first implanted base region 311. The first die 300 includes sidewall spacers 314 that extend along laterally opposite sidewalls of the patterned gate electrode 308.

The first FET 102 also includes a heavily doped (N++) implanted source region 316 in the semiconductor surface layer 304 adjacent to the implanted channel region 312. The bipolar transistor 150 further includes a heavily doped (N++) second implanted base region 317 adjacent to the implanted collector region 313 and the first implanted base region 311 in the semiconductor surface layer 304. In one example, the implanted regions 316 and 317 have approximately equal depth dimensions and dopant concentration profiles within process tolerance ranges and can be formed concurrently using a single implant process. The first die 300 also includes a field plate oxide layer 318 that extends over the gate structure 308, 314 and the dielectric layer 306. In certain implementations, the field plate oxide layer 318 can be omitted.

The first FET 102 further includes a source contact structure with a heavily doped p-type first implanted region 320 that extends between a bottom of the first conductive plug 324 and the substrate 302, and the bipolar transistor 150 includes a cathode contact structure with a heavily doped p-type second implanted region 321 (labeled P++ in the drawing). In one example, the implanted regions 320 and 321 have approximately equal depth dimensions and dopant concentration profiles within process tolerance ranges and can be formed concurrently using a single implant process.

The source contact structure of the first FET 102 also includes a conductive metal liner structure 322, such as a titanium/titanium nitride layer adjacent to the implanted source region 316 and the implanted channel region 312 along the sidewalls of a first trench that extends in the semiconductor surface layer 304 to the first implanted region 320. Also, the cathode contact structure includes a conductive metal titanium/titanium nitride layer 323 along the sidewalls of a second trench that extends in the semiconductor surface layer 304 to the second implanted region 321.

The metal layer 323 is adjacent the second implanted base region 317 and the implanted collector region 313 of the bipolar transistor 150 to electrically connect the bipolar transistor base and collector and provide diode-connection of the bipolar transistor 150 within the first semiconductor die 300. In one example, the metal layers 322 and 323 are concurrently formed by a single process or multiple shared process steps.

In one example, the source contact structure further includes a first conductive plug 324, such as a tungsten plug formed over the metal layer 322 in the first trench. The first implanted region 320 extends between the bottom of the first conductive plug 324 (including any titanium/titanium nitride 322 at the trench bottom) and the substrate 302. The cathode contact structure includes a second conductive plug 325 (e.g., a tungsten plug) formed over the metal layer 323 in the second trench. The second implanted region 321 extends between a bottom of the second conductive plug 325 (including any titanium/titanium nitride 323 at the trench bottom) and the substrate 302. In one example, the conductive plugs 324 and 325 are concurrently formed by a single process or multiple shared process steps. The first FET 102 also includes a conductive metal layer 326 connected to the source contact structure to form a field plate that extends over the field plate oxide layer 318 above the gate structure 308, 314. The source contact 320, 322, 324, 326 electrically connects the implanted source region 316 to the substrate 302 under the semiconductor surface layer 304. In addition, the bipolar transistor 150 includes a conductive metal layer 327 connected to the cathode contact structure to form a second field plate that extends over portions of the field plate oxide layer 318 above a portion of the second implanted base region 317. The cathode contact 321, 323, 325, 327 electrically connects the implanted base region 311 and the implanted collector region 313 to the substrate 302.

The first semiconductor die 300 further includes a dielectric layer 328, such as silicon dioxide, tetraethoxysilane (TEOS) based silicon oxide, or other suitable oxide material that operates as a pre-metal dielectric (PMD) layer. The bipolar transistor 150 also includes an emitter contact structure, with a heavily doped p-type implanted emitter region 330 adjacent to the first implanted base region 311 (labeled P++ in the drawing). The first FET 102 in FIG. 3 also includes a heavily doped n-type implanted region 334 (labeled N++ in the drawing) adjacent to the n-type implanted drain region 310 beneath a fourth trench through the dielectric layer 328. A conductive metal emitter contact extends in a third trench through the dielectric layer 328 between the implanted emitter region 330 and an upper metallization structure that forms the bias node 152 shown in FIG. 1. The conductive metal emitter contact in one example includes a metal layer 336, such as titanium/titanium nitride, that extends along the bottom and sidewalls of the third trench, as well as a metal structure 338 (e.g., tungsten plug).

The example bipolar transistor 150 in FIG. 3 includes a third implanted base region 332 adjacent to the first implanted base region 311. The third implanted base region 332 includes n-type majority carriers and is referred to as a base modulation implant to inhibit or prevent base reach through. In one example, the third implanted base region 332 and the implanted emitter region 330 are aligned with the third trench (e.g., along the vertical direction in FIG. 3). The first FET 102 in FIG. 3 also includes a conductive drain contact structure with a metal layer 340, such as titanium/titanium nitride, that extends along the bottom and sidewalls of the fourth trench, as well as a metal structure 342 (e.g., tungsten plug). The conductive structures 340 and 342 extend in the fourth trench between the n-type implanted region 334 and an upper metallization structure that forms the drain connection to the switching node 110 shown in FIG. 1.

The first semiconductor die 300 integrates the diode-connected bipolar transistor 150 as a temperature sensor (e.g., temperature diode) next to the source down first FET 102 to provide accurate temperature information via a signal at the bias node 152 that represents the temperature of the first FET 102. The temperature T of the integrated bipolar transistor 150 may be given by $T=q \cdot V_{BE}/(nk \cdot \ln(I_c/I_s))$, where q is the charge, $V_{BE}$ is the base-emitter voltage of the transistor 150, n is an ideal factor (e.g., a positive value at or near unity, and can be tailored by the parameters of the base modulation implant to form the region 332 in FIG. 3), k is a non-zero positive constant, $I_c$ is the collector current of the transistor 150, and $I_s$ is the p-n junction current parameter of the transistor 150. In one example, the implanted emitter region 330 is done with suitable implantation energy to separate the emitter-based junction from any defects of a silicide contact at the top of the emitter implanted region 330 to mitigate junction leakage current and achieve an ideality factor n of approximately unity to enhance the temperature sensing accuracy. The integrated temperature sensing is more accurate than a temperature sensor in a separate driver or controller die. The illustrated example also provides a temperature diode with a grounded cathode and an accessible isolated anode connection to interface with a temperature signal input of the driver circuit 122, in contrast to the body diode (body p-n junction diode) of the first FET 102 itself. In one implementation, a packaged power stage device 100 includes three dies 104, 108 and 126 in a single package, where the high side second FET 106 is stacked on the low side first FET 102, and the driver/controller die 126 is positioned alongside one of the FET dies 104, 108.

The described examples provide close integration of the temperature sensor in the low side FET die 104 to mitigate FET temperature estimation inaccuracies associated with using a temperature sensor in the driver die, where temperature differences between the driver die 126 and the FET die 104 will not affect the temperature signal provided by the diode-connected bipolar transistor 150 (e.g., temperature diode 154). The example diode-connected bipolar transistor 150 in FIG. 3 includes a collector C formed by portions of the p-type epitaxial implanted region 313, the grounded substrate 302 and the P++ implanted region 321. In this example, moreover, the transistor base is formed by the same doping process which is used to form the lightly doped drain (N-LDD) of the first FET 102. The cathode contact structure shorts the bipolar collector and base together at the grounded substrate potential, and the cathode contact structure is processed using the same processing steps used to form the deep source contact of the first FET 102.

Referring now to FIGS. 4-18, FIG. 4 shows an example method 400 of fabricating an electronic device, such as an integrated circuit or standalone device. The example method 400 is illustrated and described below in connection with fabrication of the illustrated electronic device (e.g., first die 300) of FIG. 3. FIGS. 5-18 show the first die 300 at various stages of fabrication according to the method 400.

Figure 5:
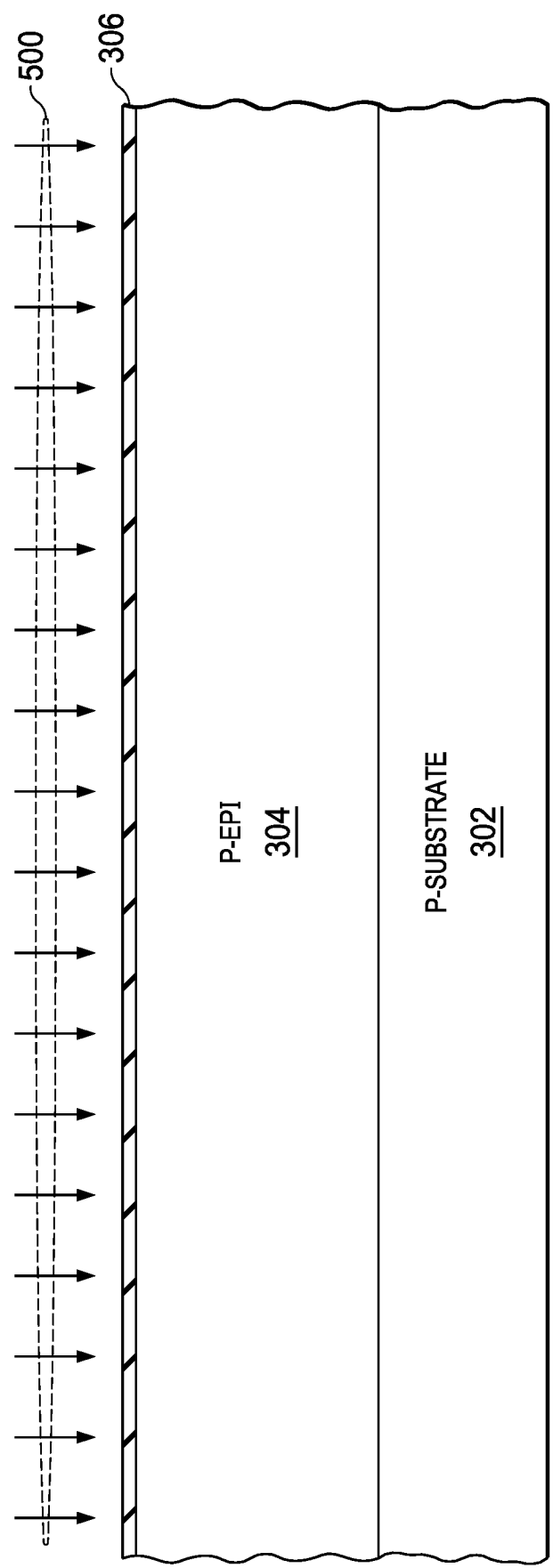
FIGS. 5-18 show partial sectional side elevation views of the die in FIG. 3 undergoing fabrication processing according to the method of FIG. 4.

The method 400 begins at 402 with forming a dielectric layer (e.g., gate dielectric) along a surface of a semiconductor surface layer (e.g., epitaxial silicon layer). FIG. 5 shows one example, in which a process 500 is performed that grows or otherwise deposits an oxide layer 306 (e.g., silicon dioxide) along the upper surface of the p-type epitaxial semiconductor surface layer 304.

Figure 4:
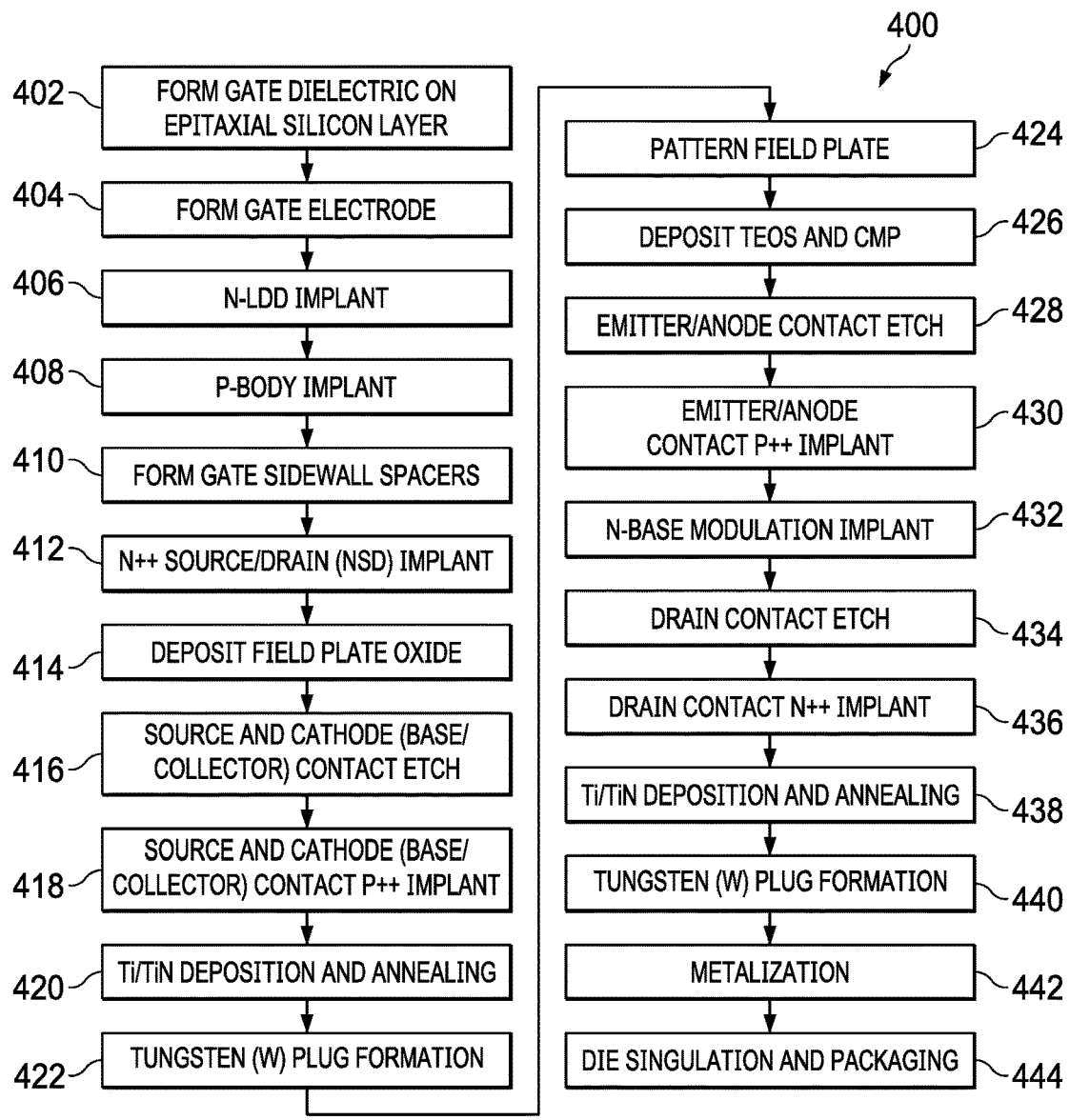
FIG. 4 shows a flow diagram of a method to fabricate an electronic device.
Figure 6:
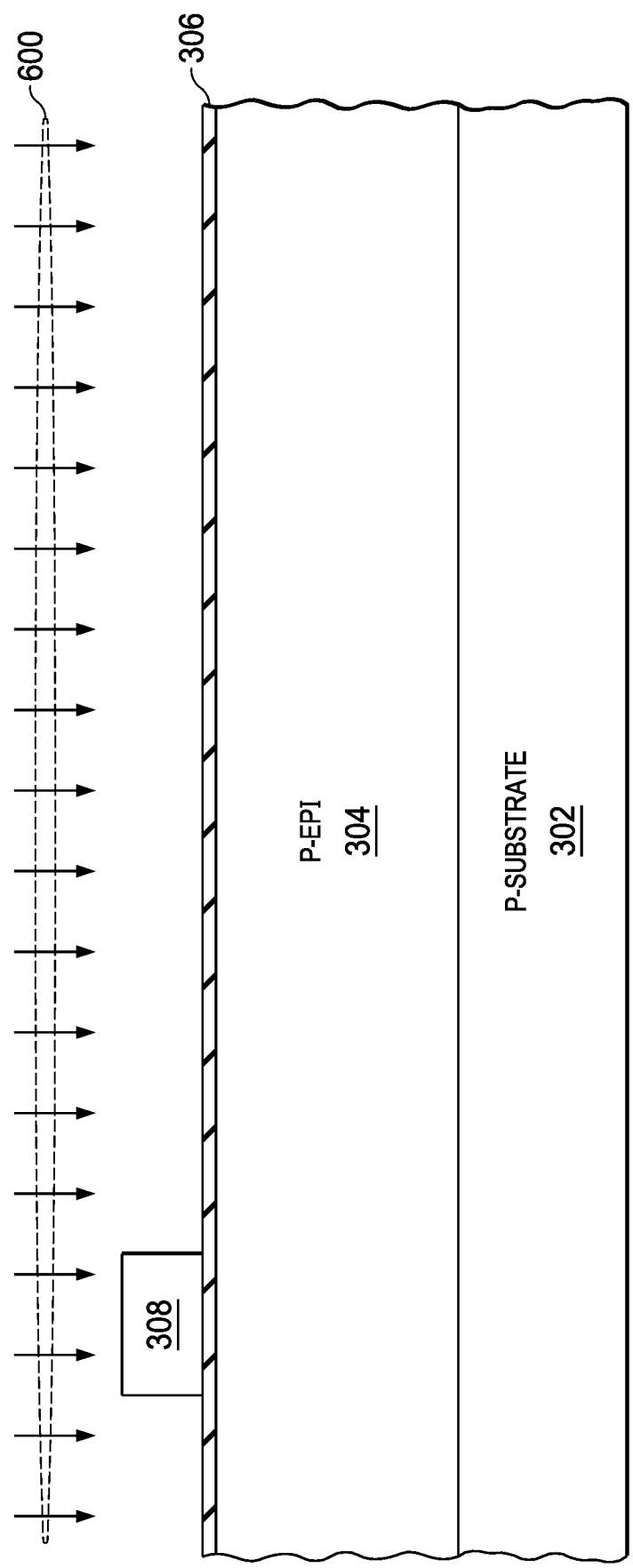

The method 400 continues at 404 in FIG. 4 with forming a gate electrode. FIG. 6 shows one example, and which a multistep process 600 is performed that forms the patterned gate electrode 308 (e.g., polysilicon) on a portion of the dielectric layer 306. The process 600 in one example includes deposition of polycrystalline silicon, and patterning the polysilicon using a suitable etch mask and etch process (not shown) to create the patterned gate electrode structure 308 shown in FIG. 6. At 404, one or more gate electrode material layers are formed above the gate dielectric layer 306. The gate electrode 308 may be formed to any suitable thicknesses using any suitable electrode material(s) and deposition process(es). The polysilicon can be doped with either n-type or p-type dopants in different examples. The dopant concentration can be tuned according to desired transistor operation for the first FET 102 of FIGS. 1 and 3.

Figure 7:
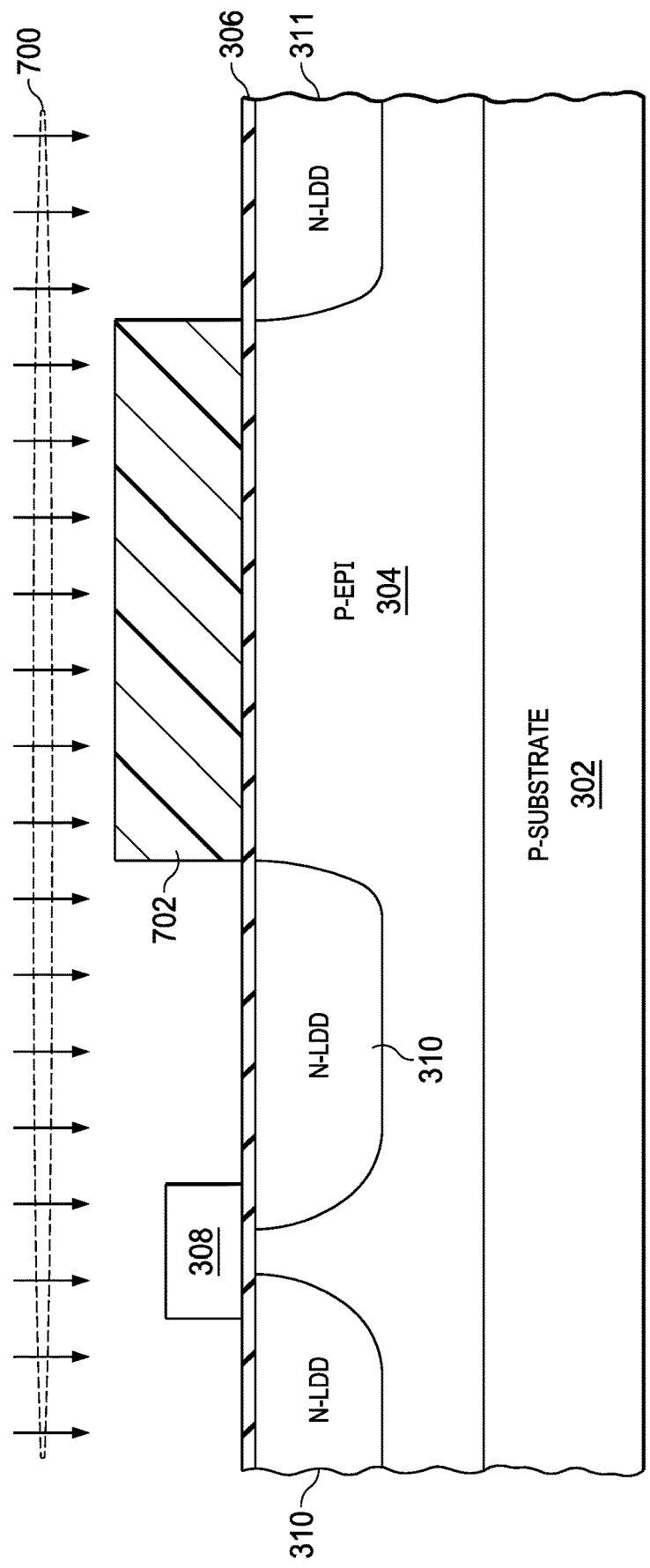

The method 400 continues at 406 in FIG. 4 with an n-type lightly doped drain (N-LDD) implantation. FIG. 7 shows one example, and which an implantation process 700 is performed with a photo resist mask 702. The implantation process 700 implants phosphorus or other n-type dopant(s) into exposed portions of the semiconductor surface layer 304 to form the implanted drain region 310 of the prospective first FET 102, and to concurrently form the implanted base region 311 of a bipolar transistor 150 adjacent to a prospective implanted emitter region (e.g., adjacent to the subsequently implanted region 330 shown in FIG. 3).

Figure 8:
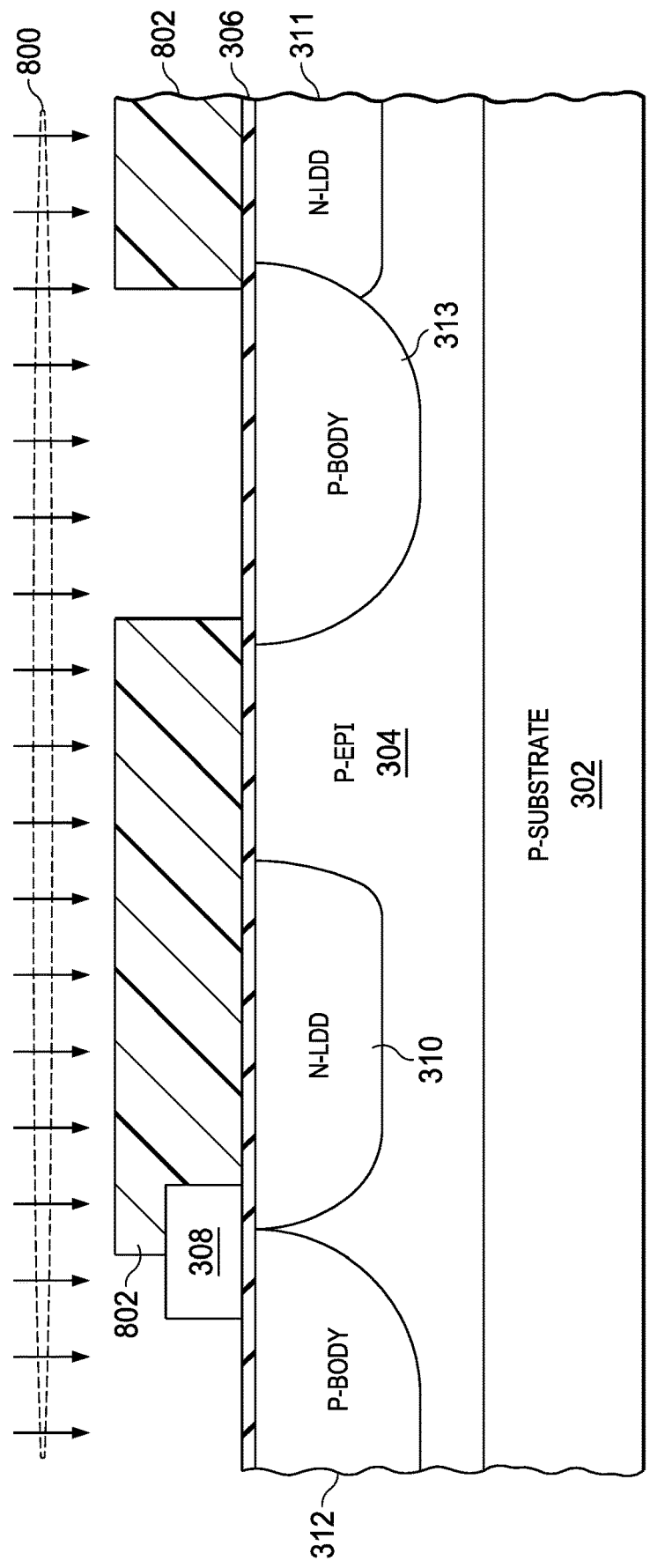

The method 400 in FIG. 4 also includes performing a second implantation process at 408. FIG. 8 shows one example, in which a second implantation process 800 (e.g., a p-body implant) is performed with a second mask 802. The process 800 implants boron or other p-type dopants into exposed portions of the semiconductor surface layer 304 to form the implanted channel region 312 of the first FET 102, and the implanted collector region 313 of the bipolar transistor 150 adjacent to the implanted base region 311. After the p-body implant in one example, photo resist is stripped, and a p-body drive annealing process is performed (not shown) to diffuse the implanted p-type dopants.

Figure 9:
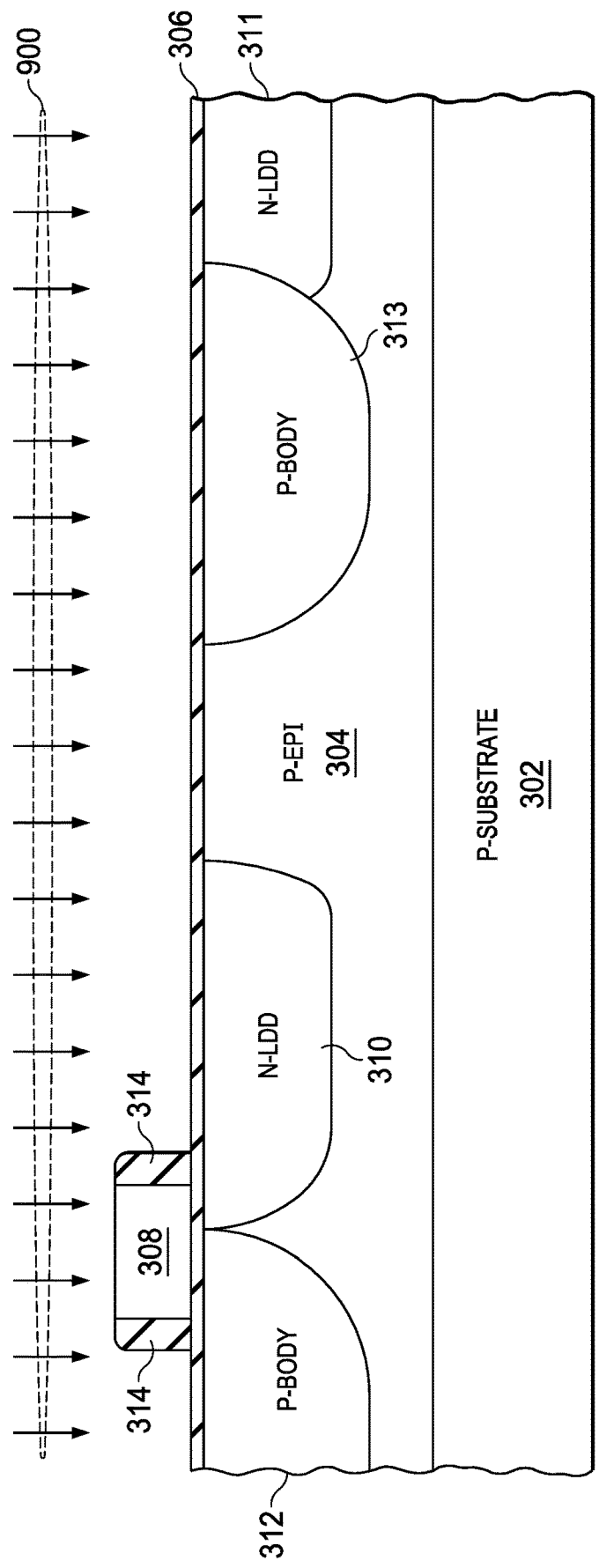
Figure 10:
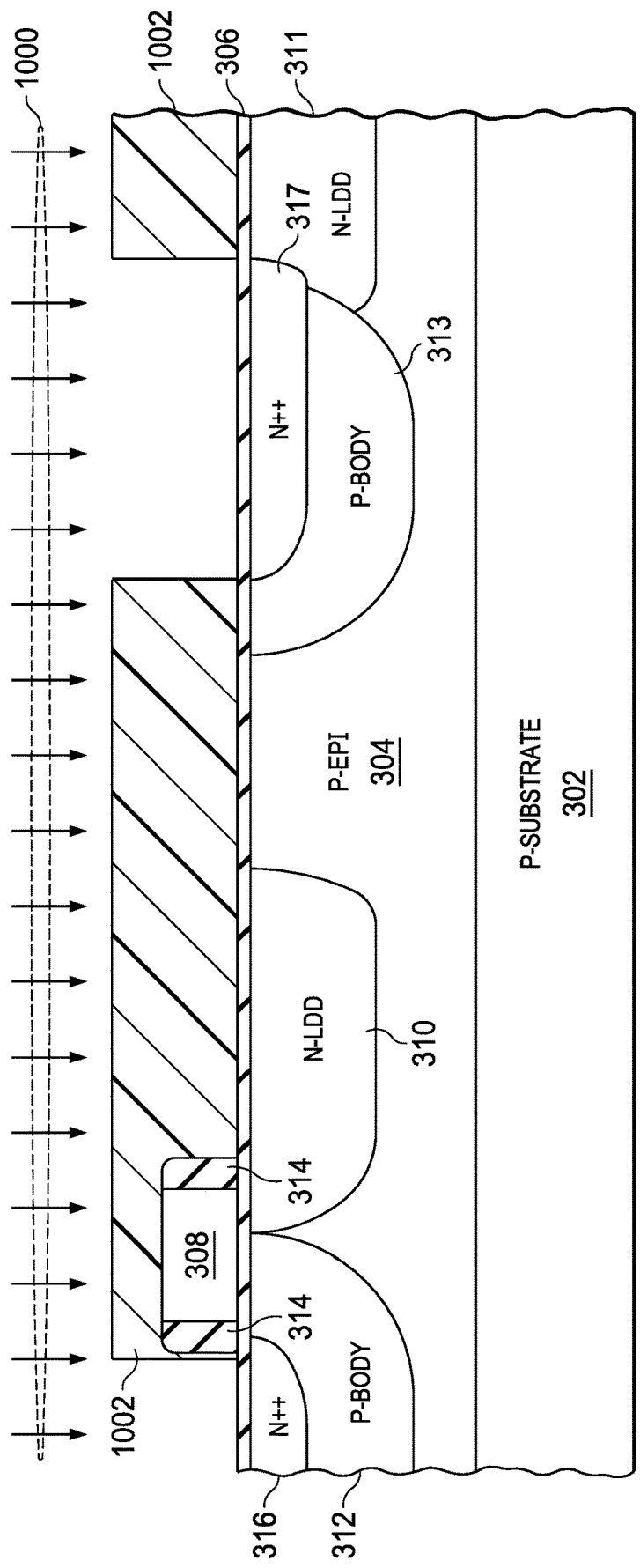

The method 400 continues with forming gate spacers at 410 in FIG. 4. FIG. 9 shows one example, in which a sidewall formation process 900 is performed that forms the sidewall spacers 314 along vertical sides of the patterned gate structure 308. At 412 in FIG. 4, an n-type source/drain implant is performed. FIG. 10 shows one example, in which an implantation process 1000 implants phosphorus or other n-type dopants using a photo resist implantation mask 1002 to form the implanted source region 316 of the first FET 102 and the second implanted base region 317 of the bipolar transistor 150 in the semiconductor surface layer 304.

Figure 11:
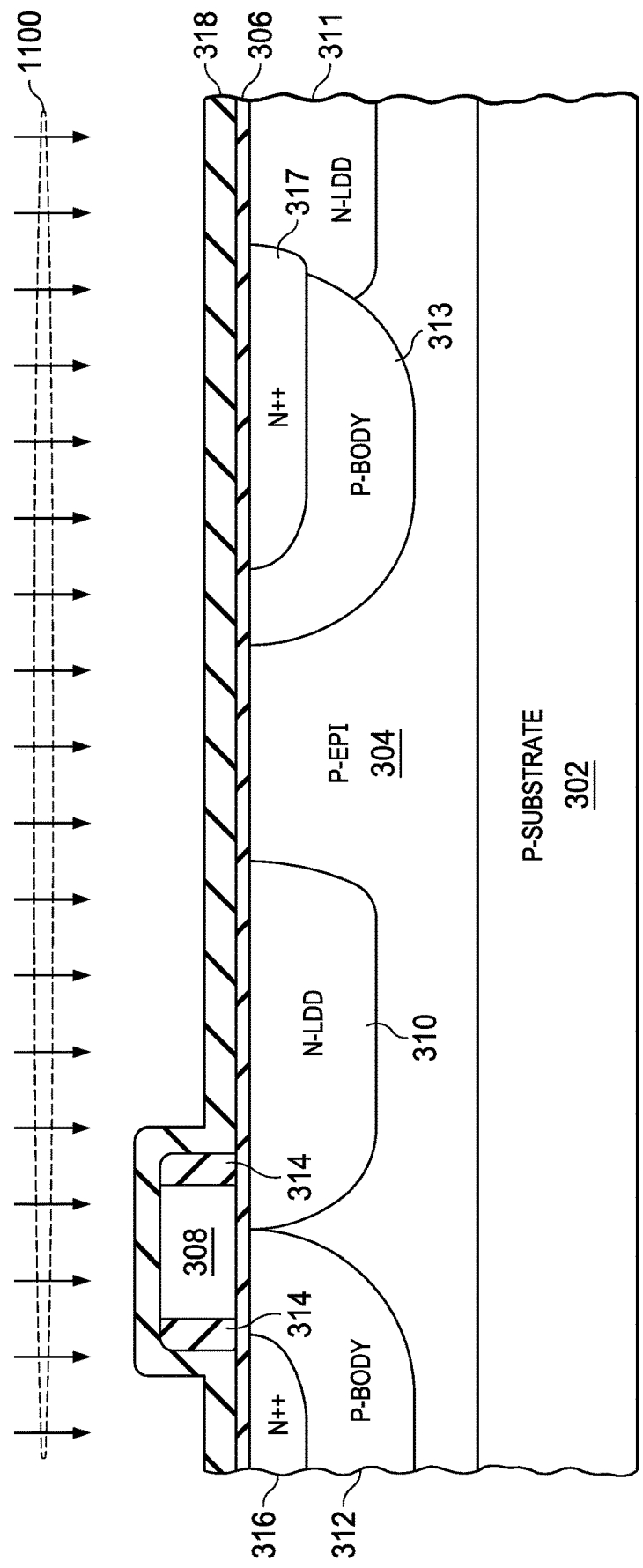

The method 400 continues at 414 with depositing a field plate oxide. FIG. 11 shows one example, in which a deposition process 1100 deposits the field plate oxide layer 318 (e.g., silicon dioxide) over the gate structure 308, 314 and the dielectric layer 306. In another example, where no field plate is included, the field plate oxide deposition at 414 is omitted.

Figure 12:
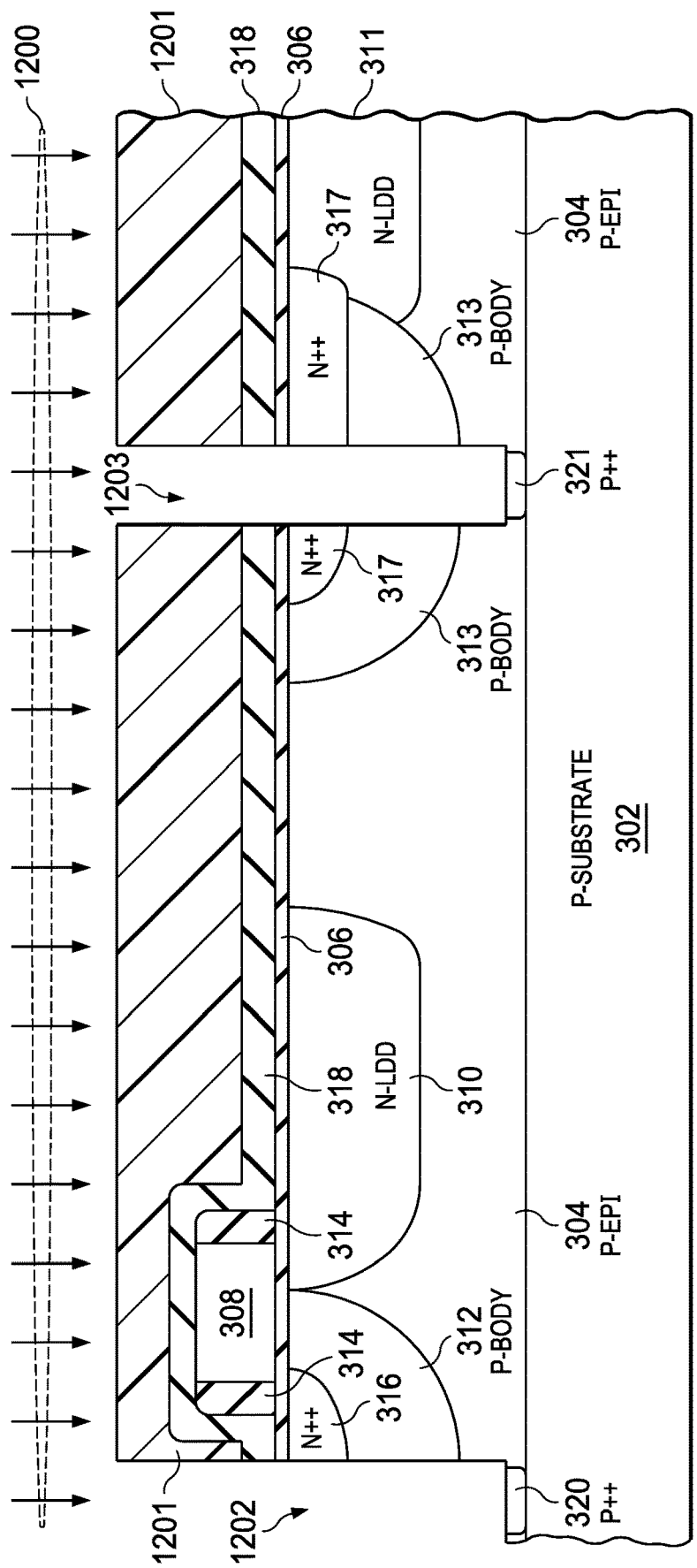

The method 400 continues at 416-424 with contact formation for a source contact and an collector/base (cathode) contact. The contact formation begins with source and cathode contact trench etching at 416. FIG. 12 shows one example, in which an etch process 1200 is performed with an etch mask 1201 that etches a first trench 1202 adjacent to the implanted n-type source region 316 and the implanted p-type channel region 312 of the first FET 102 in the semiconductor surface layer 304. The etch process 1200 concurrently etches a second trench 1203 adjacent to and through the implanted collector region 313 and the second implanted base region 317 of the bipolar transistor 150 in the semiconductor surface layer 304. In one example, the etch process etches the trenches 1202 and 1203 to a depth of approximately 0.2 μm. In the example of FIG. 12, the trenches 1202 and 1203 extend through a portion of the epitaxial semiconductor surface layer 304. In another example, the trenches 1202 and 1203 can extend into the underlying substrate 302.

At 418 in FIG. 4, the method 400 further includes implanting the first and second implanted regions 320 and 321. In one example, an implantation process at 418 implants p-type dopants (e.g., boron) into the trenches 1202 and 1203 to form the first implanted region 320 (labeled P++ in the drawing) to provide a low impedance contact for the source of the first FET 102 along the bottom of the first trench 1202 as shown in FIG. 12. The implantation at 418 also forms the second implanted region 321 (labeled P++ in the drawing) to provide a low impedance contact for the base and collector (thermal diode cathode) along the bottom of the second trench 1203.

The method 400 continues at 420 and 422 with formation of conductive contact structures in the first and second trenches 1202 and 1203 to electrically connect the implanted source region 316 to the substrate 302, and to electrically connect the implanted base and emitter regions 317 and 313 to the substrate 302. The contact formation in one example is shown generally as process 1300 in FIG. 13. At 420, a titanium/titanium nitride (Ti/TiN) layer is deposited in the trenches 1202 and 1203 and over the remainder of the upper surface of the structure including the field plate oxide layer 318, followed by an annealing process. At 422, tungsten material (W) is deposited over the titanium/titanium nitride in the trenches 1202 and 1203. The tungsten plug structure is formed by a tungsten etch back process to remove the tungsten outside the trenches 1202 and 1203.

Figure 13:
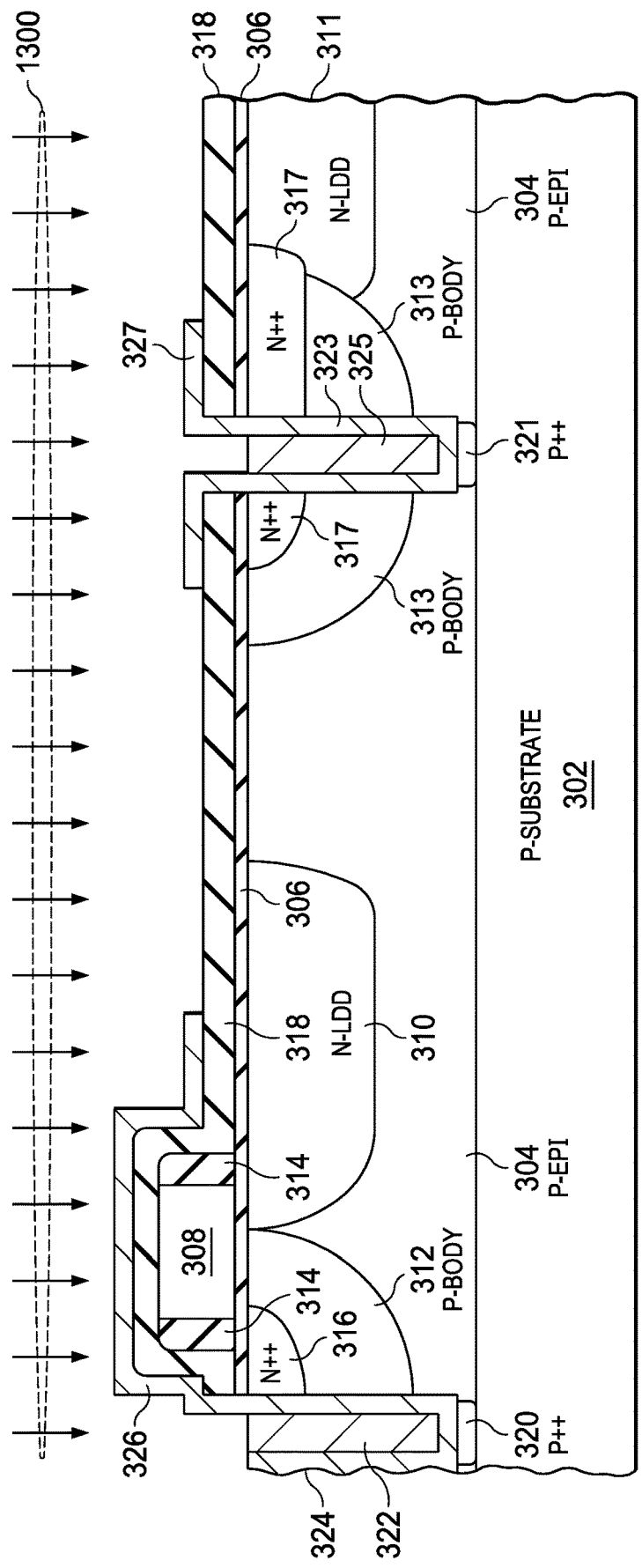

FIG. 13 shows one example, in which the processing at 420 forms the conductive metal liner structure 322 (e.g., Ti/TiN) adjacent to the implanted source region 316 and the implanted channel region 312 along the bottom and sidewalls of the first trench, and a conductive metal titanium/titanium nitride liner structure 323 adjacent to the second implanted base region 317 and the implanted collector region 313 along the bottom and sidewalls of the second trench. The processing at 422 in this example forms the first conductive plug 324 (e.g., tungsten) the metal layer 322 in the first trench, and forms the second conductive plug 325 (e.g., tungsten) over the metal layer 323 in the second trench. The tungsten formation in one example includes a blanket tungsten deposition, followed by the etch back process, which leaves the plug structure shown in FIG. 13. The first implanted region 320 extends between the bottom of the first conductive plug 324 (including any titanium/titanium nitride 322 at the trench bottom) and the substrate 302, and the second implanted region 321 extends between the bottom of the second conductive plug 325 (including any titanium/titanium nitride 323 at the trench bottom) and the substrate 302.

The processing 1300 in one example also includes field plate patterning at 424 in FIG. 4. FIG. 13 shows one example after the field plate patterning at 424 via a masked etch to remove exposed Ti/Tin, leaving the patterned Ti/TiN field plate structures 326 connected to the source contact structure to form a field plate that extends over the field plate oxide layer 318 above the gate structure 308, 314. In addition, the field plate patterning process at 424 also patterns a conductive metal layer 327 connected to the cathode contact structure to form a second field plate that extends over portions of the field plate oxide layer 318 above a portion of the second implanted base region 317. The field plate 326 of the first FET 102 is a continuous structure with the Ti/TiN structure 322 in the first trench, and provides an electrically grounded shield over the gate electrode 308, which is spaced from the gate structure by the field plate oxide layer 318. In addition, the conductive metal layer 327 extends over a portion of the field plate oxide layer 318 of the bipolar transistor 150 and is a continuous structure with the Ti/TiN structure 323 in the second trench. In another example, the field plate structures 326 and 327, and the field plate oxide 318 can be omitted, and the processing at 414 and 424 in FIG. 4 can be omitted.

Figure 14:
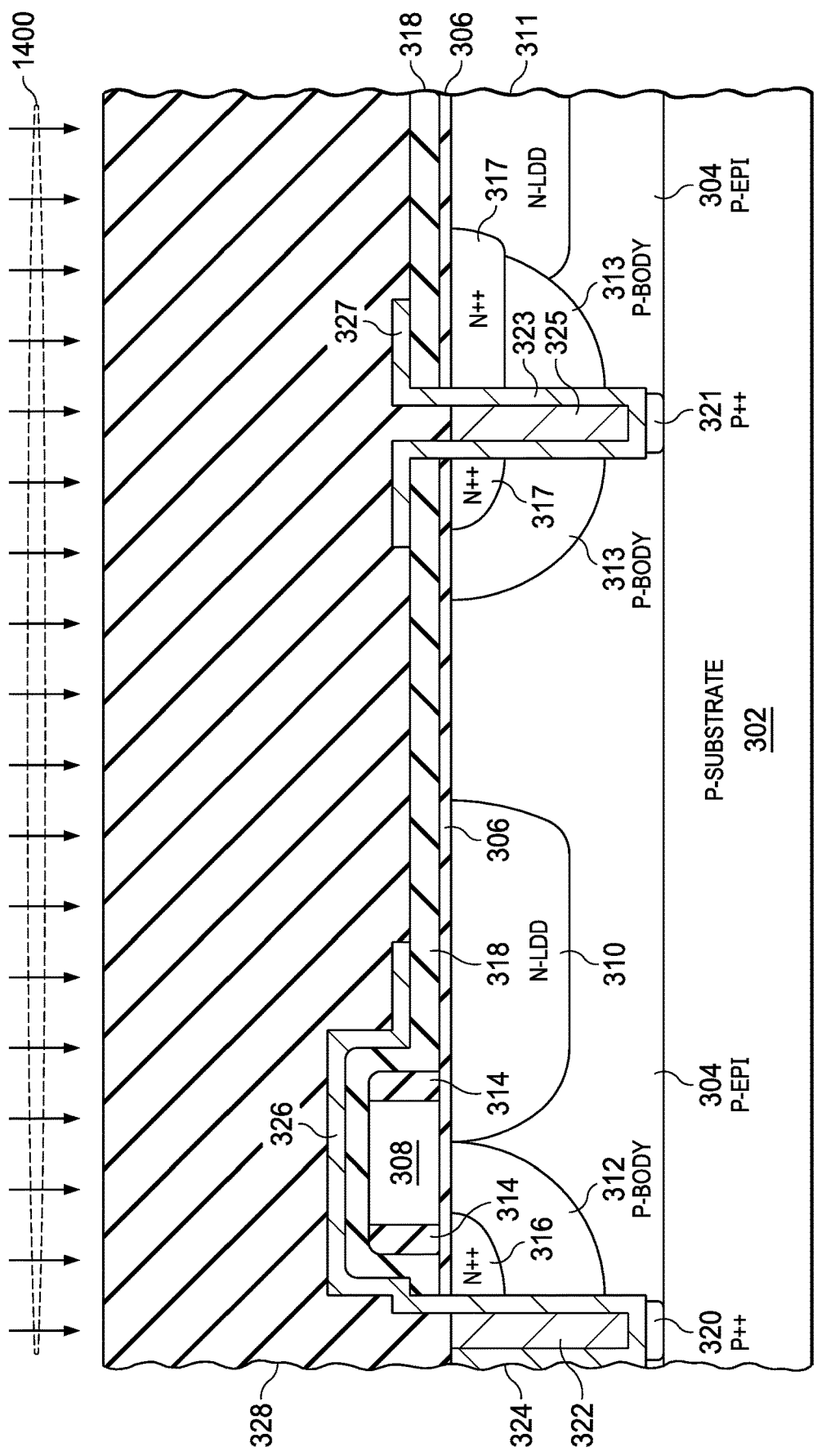

The method 400 continues at 426 in FIG. 4 with deposition and planarizing of a pre-metal dielectric (PMD) layer. FIG. 14 shows one example, in which a deposition process 1400 is performed that deposits an oxide or other dielectric material 328, such as tetraethyl orthosilicate or tetraethoxysilane (TEOS) based silicon oxide above the semiconductor surface layer 304. The deposited dielectric material 328 is then planarized, for example, using chemical mechanical polishing (CMP) to provide a planar top surface as shown in FIG. 14.

Figure 15:
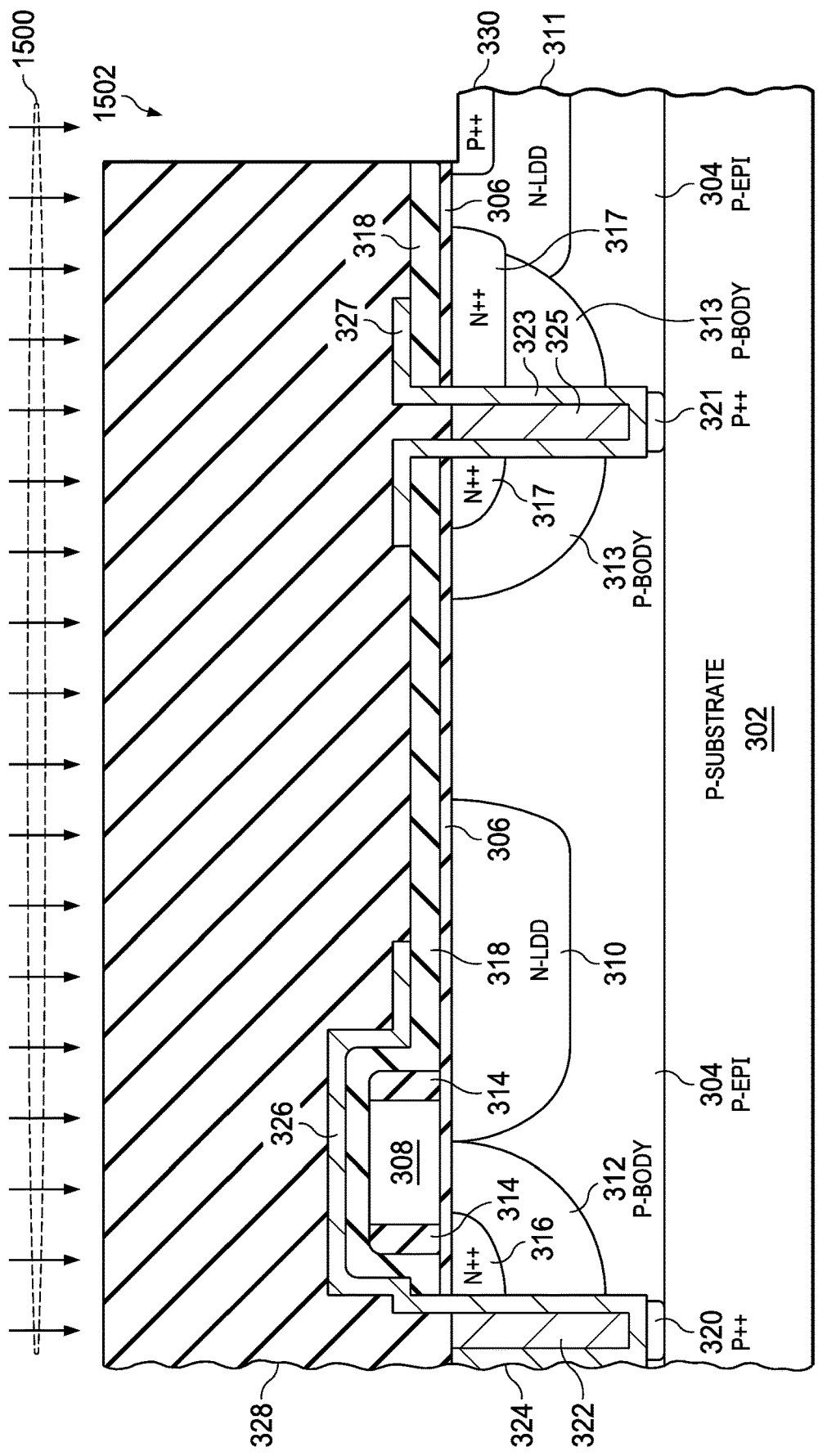

The method 400 in FIG. 4 further includes forming an emitter (e.g., anode) contact trench at 428, and performing a third implantation process that forms the implanted emitter region 330 in the semiconductor surface layer 304 at 430 in FIG. 4. FIG. 15 shows one example, in which an etch process is performed (not shown) with an etch mask (not shown) to form a third trench 1502 in the dielectric layer 328 above the semiconductor surface layer 304. In one example, as shown in FIG. 15, the etch process etches the trench 1502 through the dielectric layer 328, the field plate oxide layer 318, the gate dielectric layer 306, and into the n-type first implanted base region 311 of the semiconductor surface layer 304. An implantation process is performed at 430 in FIG. 4. FIG. 15 shows one example, in which a third implantation process 1500 is performed that implants p-type dopants (e.g., boron) through the third trench 1502 and into the semiconductor surface layer 304 to form the implanted emitter region 330 of the bipolar transistor 150.

Figure 16:
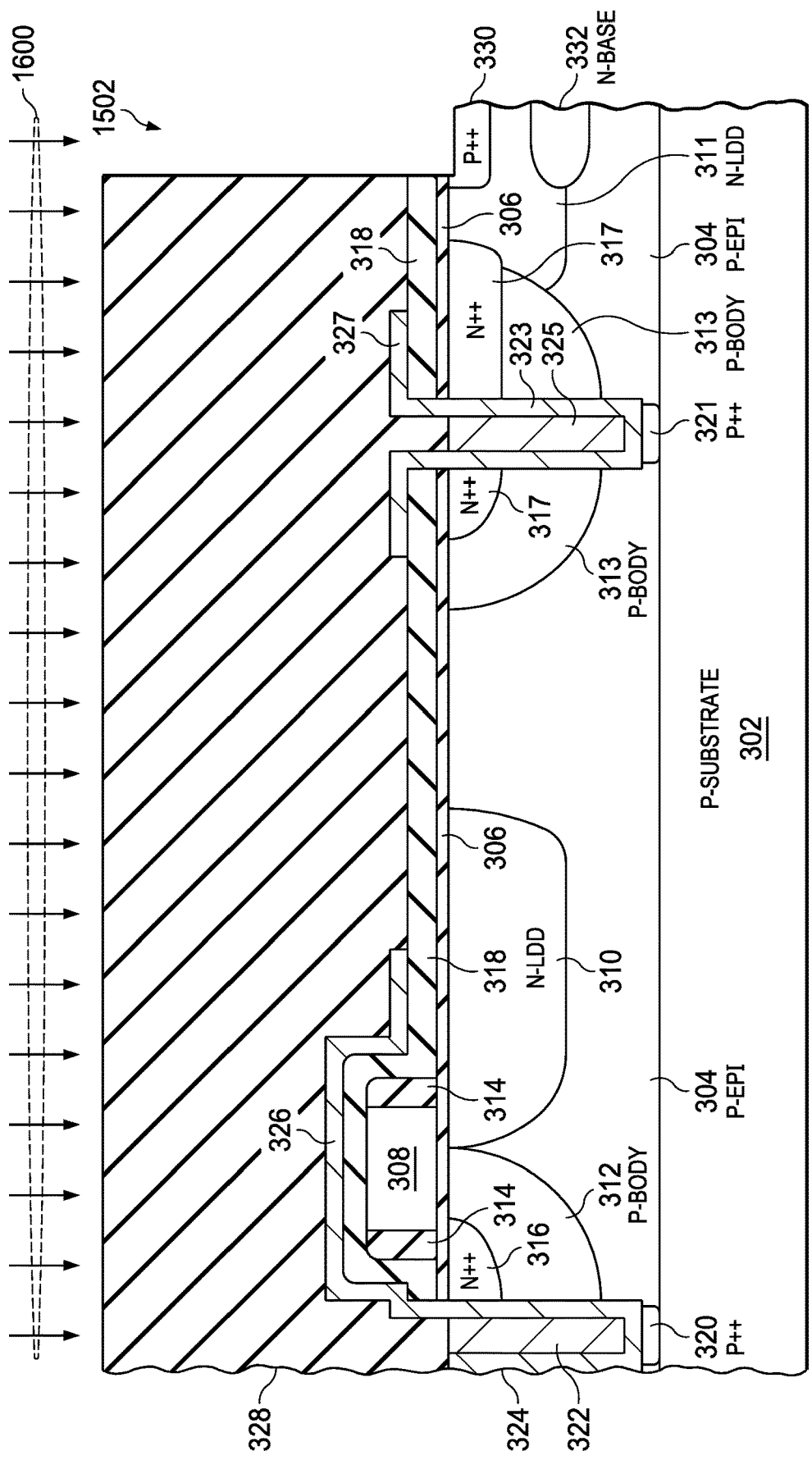

At 432 in FIG. 4, the third implanted base region 332 is implanted through the third trench 1502 (e.g., base modulation implant). FIG. 16 shows one example, in which a fourth implantation process 1600 is performed that implants n-type dopants through the third trench 1502 and into the semiconductor surface layer 304 to form the third implanted base region 332 (labeled N-BASE in the drawing) beneath the implanted emitter region 330. The base modulation implant at 432 inhibits or prevents base reach through. As shown in FIG. 16, the third implanted base region 332 and the implanted emitter region 330 are aligned with the third trench 1502.

Figure 17:
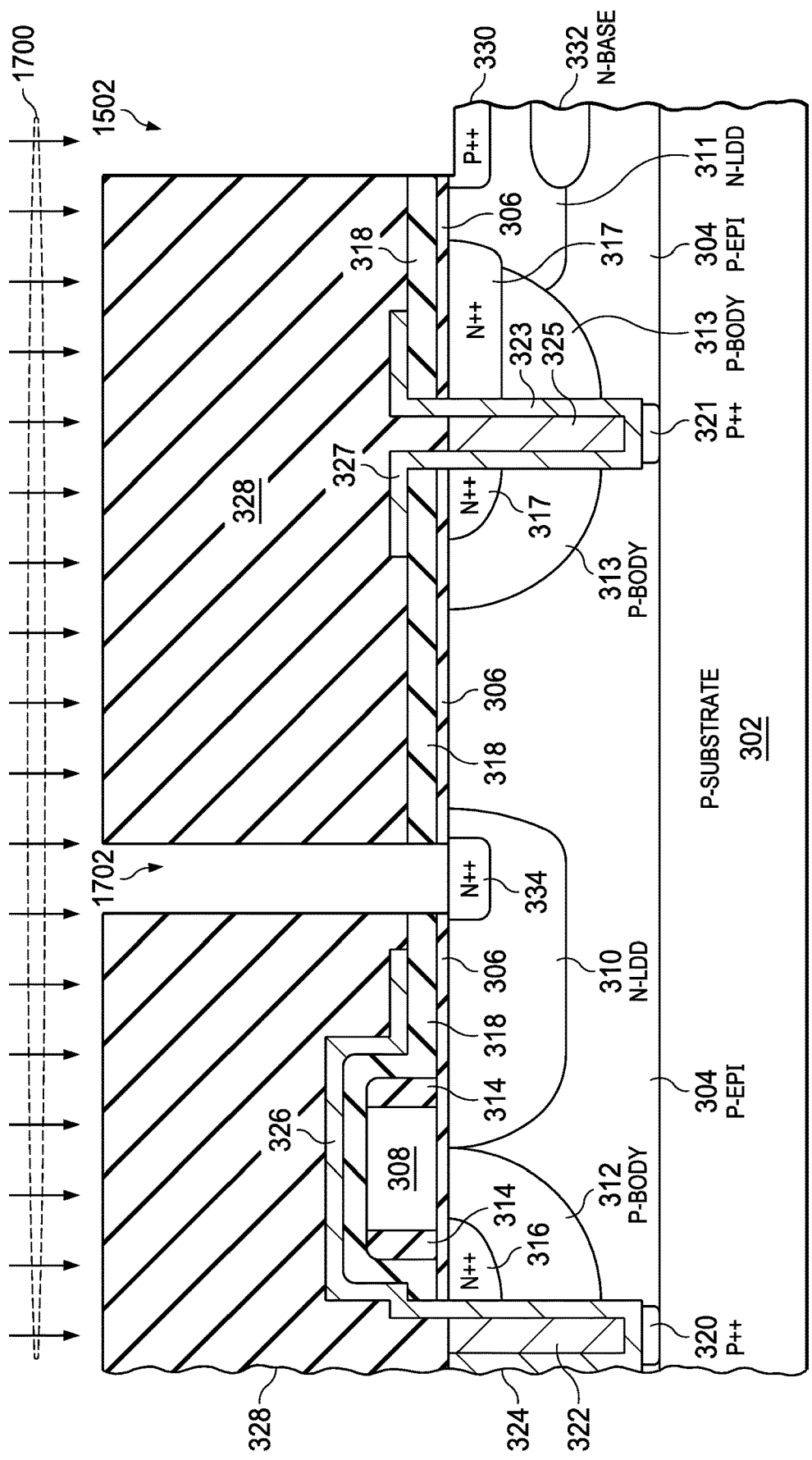

A fourth trench is etched at 434 for a drain contact of the first FET 102. FIG. 17 shows one example, in which a fourth trench 1702 is etched through the dielectric layer 328, the field plate oxide layer 318, and the gate dielectric layer 306. In one example, the fourth trench 1702 can extend into the semiconductor surface layer 304. A drain contact implant is performed at 436 in FIG. 4. FIG. 17 shows one example in which an implantation process 1700 is performed that implants phosphorus or other n-type dopants through the trench 1702 and into the n-type implanted drain region 310 to form the implanted drain contact region 334 (labeled N++ in the drawing).

Figure 18:
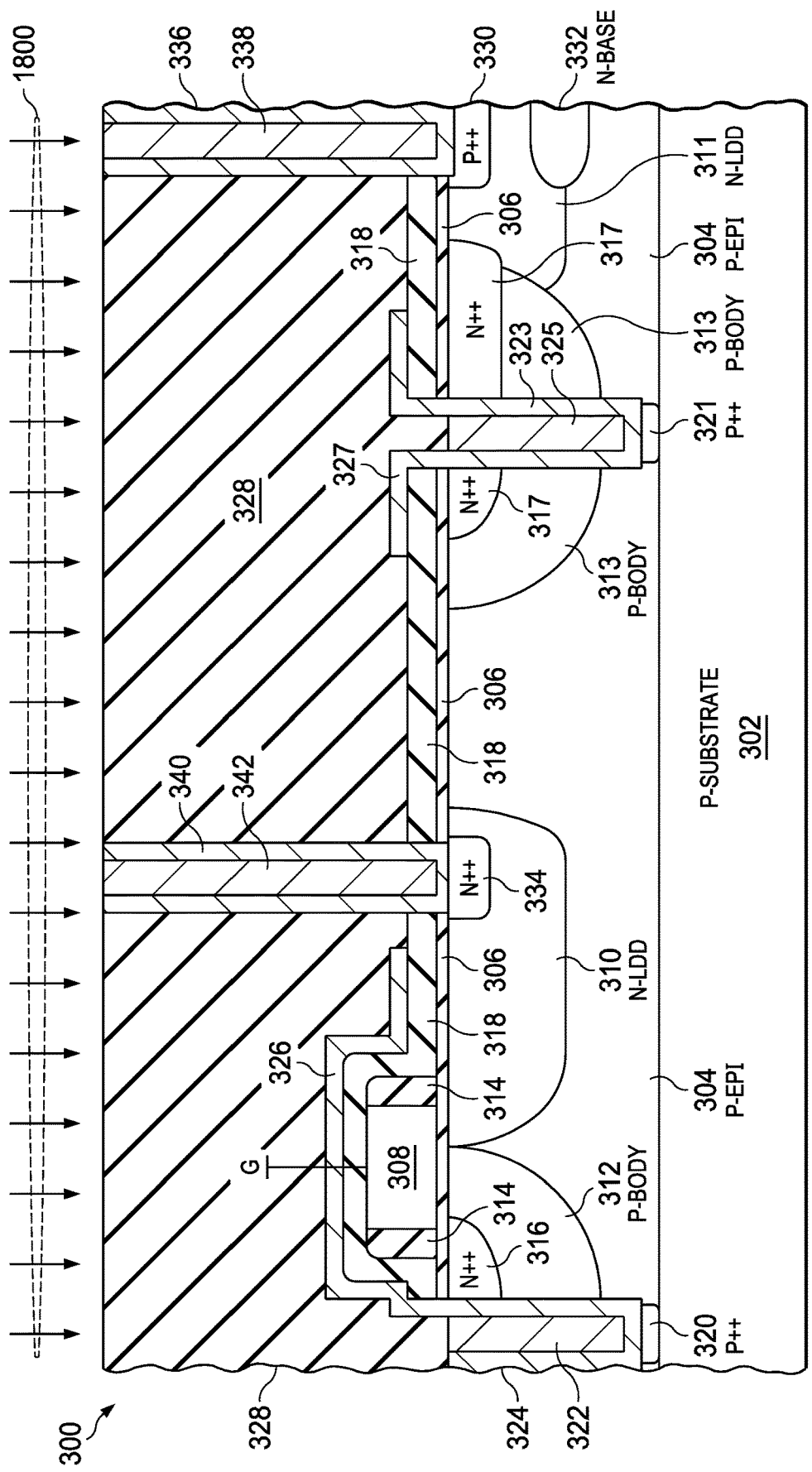

The method 400 continues at 438 and 440 to form conductive structures in the third and fourth trench is 1502 and 1702, respectively. In one example, a titanium/titanium nitride (Ti/TiN) layer is deposited at 438 in the third and fourth trenches 1502 and 1702, followed by an annealing process. A tungsten material (W) is deposited at 440 over the titanium/titanium nitride in the trenches 1502 and 1702. The W plug can be formed by a tungsten CMP or tungsten etch back process which will remove the tungsten and Ti/TiN materials outside the trenches 1502 and 1702. FIG. 18 shows one example, in which the processing at 438 forms the conductive metal liner structure 336 (e.g., Ti/TiN) in the third trench for the emitter/anode contact of the bipolar transistor 150, and concurrently forms the conductive metal liner structure 340 (e.g., Ti/TiN) in the fourth trench for the drain contact of the first FET 102. FIG. 18 shows a deposition process 1800 that deposits tungsten or other conductive metal 338, 342 into the third and fourth trenches to complete the respective emitter and drain contact structures.

The method 400 continues at 442 in FIG. 4 with metallization processing. In the example of FIG. 3, the metallization processing includes formation of copper or other conductive metal features 110 and 152 on the top side of the dielectric layer 328 for external connection to the drain of the first FET 102 and the emitter/anode of the bipolar transistor 150, respectively. The method 400 further includes die singulation (e.g., separation) and packaging at 444 in FIG. 4. In one example, the packaging includes lead frame and conductive clip attachment and stacking, along with final package structure molding to produce a packaged power module 200 as shown in FIG. 2 above.

As seen above, the example method 400 provides a cost-effective fabrication technique to incorporate a temperature diode 154 (e.g., implemented as a diode-connected bipolar transistor 150) in the same die 104 as the low side first FET 1024 improved temperature monitoring. The method 400 provides concurrent fabrication of the first FET 102 and the bipolar transistor 150 with many shared processing steps, with the addition of only one extra mask to create the implanted emitter region 330. In addition, the example method 400 provides a self-aligned base modulation implant to form the third implanted base region 332 to inhibit or prevent base reach through. In addition, the example method 400 allows tailoring the emitter implantation energy to keep the emitter-base junction spaced apart from the silicide contact area to reduce the junction leakage current to facilitate accurate temperature sensing by the integrated temperature diode 154. The described examples provide an integrated temperature diode with an isolated anode terminal for connection to sensing circuitry of the driver circuit 122 on a separate die 126 (FIG. 1) to facilitate switching circuit control that accommodates temperature considerations, with improved temperature sensing accuracy compared to other approaches that include thermal sensing in the driver die. Described examples also provide a bipolar transistor base connected to the collector substrate 302 by a deep trench conductive contact structure 323, 325, unlike conventional bipolar junction transistor configurations that provide diode-connection using upper metallization layer interconnections that require further masks during fabrication. The described examples also facilitate cost-effective manufacturing with only a single additional mask with base doping modulation and self-aligned emitter contact construction. In addition, the described examples provide internal grounding of the temperature diode cathode and an isolated anode contact 152 to allow simple interconnection to a sensing circuit of the driver circuit 122 (e.g., wire bonding during packaging at 444).

Figure 19:
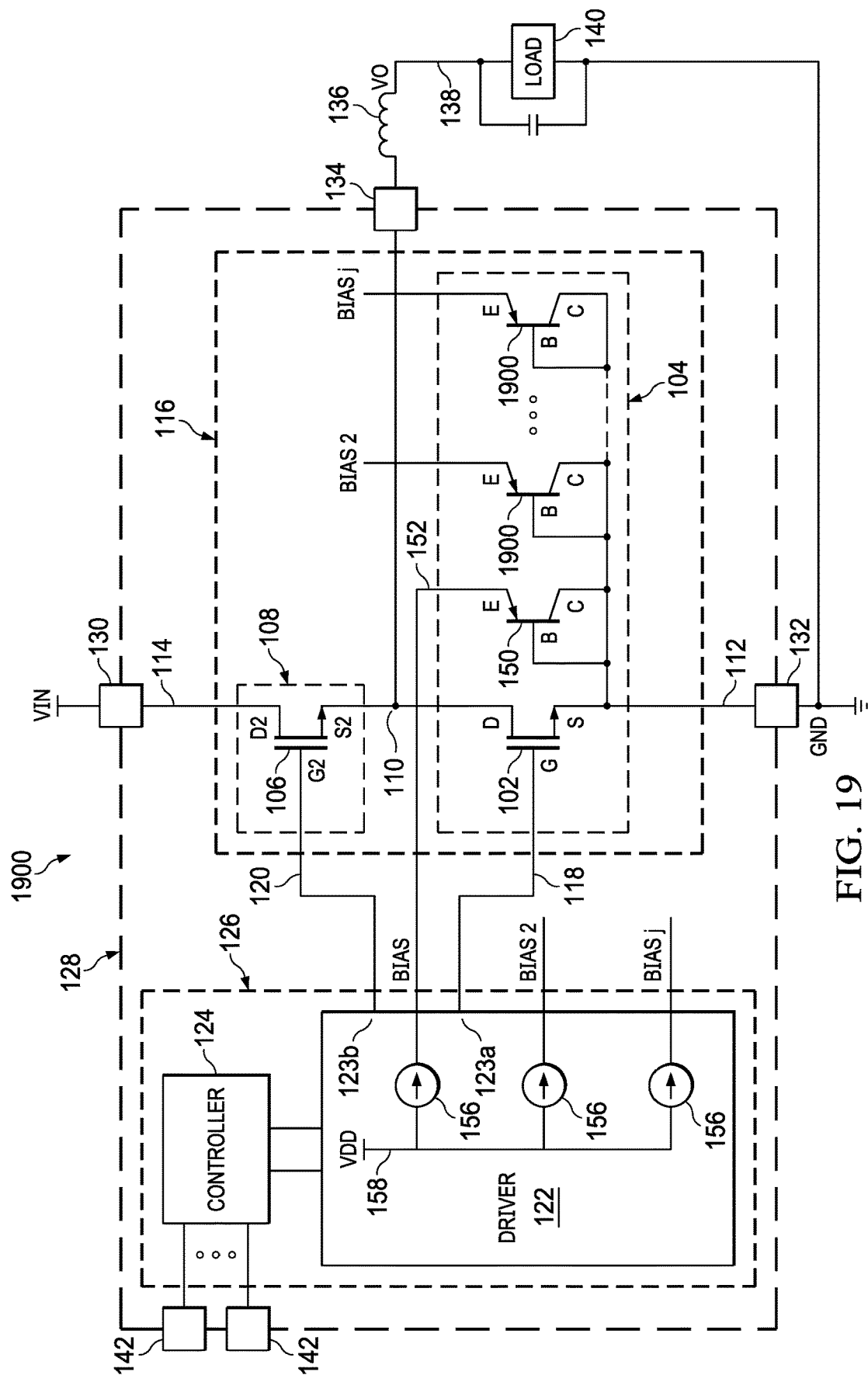
FIG. 19 shows a schematic diagram of another DC-DC converter that includes a packaged power stage electronic device with a source down low side field effect transistor and multiple integrated temperature sensors in a single die.

FIG. 19 shows another example implementation of a DC-DC converter 1900 that includes a packaged power stage electronic device 128 generally as described above in connection with FIG. 1. The example of FIG. 19 includes a source down low side field effect transistor 102 integrated in a single die 104 and multiple integrated temperature sensors respectively connected to a corresponding bias node. This implementation provides an integer number of temperature diodes, each with an anode connected to a corresponding bias node, and a cathode connected to the reference node 112 (GND) as previously described in connection with FIG. 1. The temperature diodes in this example are implemented as multiple, diode-connected, bipolar transistors, including the above-described diode-connected bipolar transistor 150 (e.g., FIG. 3), as well as a second diode-connected bipolar transistor 1900. As schematically shown in FIG. 19, the first die 104 can have an integer number j-1 further diode-connected bipolar transistors 1900, where j is a positive integer. The second diode-connected bipolar transistor 1900 includes a second emitter E connected to a corresponding second bias node with a second bias signal BIAS 2, a second base B connected to the reference node 112, and a second collector C connected to the reference node 112. In one implementation, the multiple diode-connected bipolar transistors 150, 1900 are each formed in the first die 104 next to (e.g., proximate) the first FET 102. In one example, two diode-connected bipolar transistors 150, 1900 form a pair of temperature diodes with given area ratio (1:N). In this example, the temperature sensing operates in a differential mode to minimize the impact of process variation in the construction of the individual temperature diodes. In this example, the temperature T sensed by the parallel-connected temperature diodes is given as $T = q \cdot (V_{BE1} - V_{BE2})/(nk \cdot \ln(1/N))$, where $V_{BE1}$ is the base-emitter voltage of the first diode-connected bipolar transistor 150, $V_{BE2}$ is the base-emitter voltage of the second diode-connected bipolar transistor 1900, q is the charge, n is the ideal factor, and k is a constant as discussed above.

Modifications are possible in the described embodiments, and other embodiments are possible, within the scope of the claims.

The following is claimed:

1. An electronic device, comprising:
    a first semiconductor die, including:
        a first field effect transistor (FET), including a drain connected to a switching node, a source connected to a reference node, and a gate connected to a first switch control node, and
        a temperature diode, including a cathode connected to the reference node, and an anode connected to a bias node;
    a second FET, including:
        a second drain connected to an input node,
        a second source connected to the switching node, and
        a second gate connected to a second switch control node;
    a driver circuit, including:
        a first output connected to the first switch control node,
        a second output connected to the second switch control node, and
        a third output connected to the bias node; and
    a package structure that encloses the first semiconductor die, the second FET, and the driver circuit.

2. The electronic device of claim 1, wherein the temperature diode includes a diode-connected bipolar transistor that includes:
    an emitter connected to the bias node;
    a base connected to the reference node; and
    a collector connected to the reference node.

3. The electronic device of claim 2, wherein the temperature diode includes a second diode-connected bipolar transistor, the second diode-connected bipolar transistor including:
    a second emitter connected to a second bias node;
    a second base connected to the reference node; and
    a second collector connected to the reference node.

4. The electronic device of claim 2, wherein the first semiconductor die includes:
    a substrate connected to the reference node;
    a source contact that electrically connects the source to the substrate; and
    a cathode contact that electrically connects the base and the collector to the substrate.

5. The electronic device of claim 4,
    wherein the source contact includes:
        a first conductive plug in a first trench of a semiconductor surface layer, and
        a first implanted region that extends between a bottom of the first conductive plug and the substrate; and
    wherein the cathode contact includes:
        a second conductive plug in a second trench of the semiconductor surface layer, and
        a second implanted region that extends between a bottom of the second conductive plug and the substrate.

6. The electronic device of claim 2,
    wherein the emitter includes an implanted emitter region in the semiconductor surface layer, the implanted emitter region including majority carriers of a first conductivity type;
    wherein the base includes:
        a first implanted base region adjacent to the implanted emitter region in the semiconductor surface layer, the first implanted base region including majority carriers of a second conductivity type,
        a second implanted base region that extends between the first implanted base region and the cathode contact in the semiconductor surface layer, the second implanted base region including majority carriers of the second conductivity type, and
        a third implanted base region adjacent to the first implanted base region, the third implanted base region including majority carriers of the second conductivity type; and
    wherein the collector includes an implanted collector region adjacent to the first implanted base region, the second implanted base region, and the cathode contact in the semiconductor surface layer, the implanted collector region including majority carriers of the first conductivity type.

7. The electronic device of claim 6,
    wherein the first semiconductor die includes an emitter contact that extends in a third trench of a dielectric layer between the implanted emitter region and the bias node; and
    wherein the third implanted base region and the implanted emitter region are aligned with the third trench.

8. The electronic device of claim 1,
    wherein the second FET is in a second semiconductor die; and wherein the package structure encloses the second semiconductor die.

9. The electronic device of claim 8, wherein the first and second semiconductor dies are stacked.

10. The electronic device of claim 8,
wherein the driver circuit is in a third semiconductor die; and
wherein the package structure encloses the third semiconductor die.

11. An electronic device, comprising:
a first semiconductor die, including:
 a first field effect transistor (FET), including a drain connected to a switching node, a source connected to a reference node, and a gate connected to a first switch control node, and
 a temperature diode, including a cathode connected to the reference node, and an anode connected to a bias node;
a second semiconductor die, including a second FET, the second FET including:
 a second drain connected to an input node,
 a second source connected to the switching node, and
 a second gate connected to a second switch control node; and
a package structure that encloses the first semiconductor die and the second semiconductor die.

12. The electronic device of claim 11, wherein the temperature diode includes a diode-connected bipolar transistor that includes:
an emitter connected to the bias node;
a base connected to the reference node; and
a collector connected to the reference node.

13. The electronic device of claim 12, wherein the temperature diode includes a second diode-connected bipolar transistor, the second diode-connected bipolar transistor including:
an emitter connected to the bias node;
a base connected to a second reference node; and
a collector connected to the reference node.

14. The electronic device of claim 12, wherein the first semiconductor die includes:
a substrate connected to the reference node;
a source contact that electrically connects the source to the substrate; and
a cathode contact that electrically connects the base and the collector to the substrate.

15. The electronic device of claim 14,
wherein the source contact includes:
 a first conductive plug in a first trench of a semiconductor surface layer, and
 a first implanted region that extends between a bottom of the first conductive plug and the substrate; and
wherein the cathode contact includes:
 a second conductive plug in a second trench of the semiconductor surface layer, and
 a second implanted region that extends between a bottom of the second conductive plug and the substrate.

16. The electronic device of claim 12,
wherein the emitter includes an implanted emitter region in the semiconductor surface layer, the implanted emitter region including majority carriers of a first conductivity type;
wherein the base includes:
 a first implanted base region adjacent to the implanted emitter region in the semiconductor surface layer, the first implanted base region including majority carriers of a second conductivity type,
 a second implanted base region that extends between the first implanted base region and the cathode contact in the semiconductor surface layer, the second implanted base region including majority carriers of the second conductivity type, and
 a third implanted base region adjacent to the first implanted base region, the third implanted base region including majority carriers of the second conductivity type; and
wherein the collector includes an implanted collector region adjacent to the first implanted base region, the second implanted base region, and the cathode contact in the semiconductor surface layer, the implanted collector region including majority carriers of the first conductivity type.

17. The electronic device of claim 16,
wherein the first semiconductor die includes an emitter contact that extends in a third trench of a dielectric layer between the implanted emitter region and the bias node; and
wherein the third implanted base region and the implanted emitter region are aligned with the third trench.

18. The electronic device of claim 11, wherein the first and second semiconductor dies are stacked.

19. A method of forming an electronic device, the method comprising:
forming a dielectric layer along a surface of a semiconductor surface layer, the semiconductor surface layer including majority carrier dopants of a first conductivity type;
with a first mask, performing a first implantation process that implants dopants of a second conductivity type into the semiconductor surface layer to form:
 an implanted drain region of a field effect transistor (FET), and
 an implanted base region of a bipolar transistor adjacent to an implanted emitter region of the bipolar transistor;
with a second mask, performing a second implantation process that implants dopants of the first conductivity type into the semiconductor surface layer to form:
 an implanted channel region of the FET, and
 an implanted collector region of the bipolar transistor adjacent to the implanted base region;
with an etch mask, performing an etch process that etches:
 a first trench adjacent to an implanted source region of the FET in the semiconductor surface layer, and
 a second trench adjacent to the implanted collector region and a second implanted base region of the bipolar transistor in the semiconductor surface layer;
forming a source contact in and below the first trench that electrically connects the implanted source region to a substrate under the semiconductor surface layer; and
forming a cathode contact in and below the second trench that electrically connects the implanted base region and the implanted collector region to the substrate.

20. The method of claim 19, further comprising:
forming a third trench in a dielectric layer above the semiconductor surface layer;
performing a third implantation process that implants dopants of the first conductivity type through the third trench and into the semiconductor surface layer to form the implanted emitter region of the bipolar transistor;
performing a fourth implantation process that implants dopants of the second conductivity type through the third trench and into the semiconductor surface layer to form a third implanted base region of the bipolar transistor beneath the implanted emitter region; and forming an emitter contact in the third trench.

\* \* \* \* \*